United States Patent [19]
Kodama et al.

[11] Patent Number: 5,935,269
[45] Date of Patent: Aug. 10, 1999

[54] CRC CODE GENERATION CIRCUIT, CODE ERROR DETECTION CIRCUIT AND CRC CIRCUIT HAVING BOTH FUNCTIONS OF THE CRC CODE GENERATION CIRCUIT AND THE CODE ERROR DETECTION CIRCUIT

[75] Inventors: Yukio Kodama; Kazuo Murakami, both of Tokyo, Japan

[73] Assignee: Mitsubishi Denki Kabushiki Kaisha, Tokyo, Japan

[21] Appl. No.: 08/827,061

[22] Filed: Mar. 26, 1997

[30] Foreign Application Priority Data

Sep. 25, 1996 [JP] Japan .................................... 8-253340

[51] Int. Cl.[6] .............................................. H03M 13/00
[52] U.S. Cl. ........................................ 714/781; 714/807
[58] Field of Search ..................................... 371/53, 37.07, 371/37.12

[56] References Cited

U.S. PATENT DOCUMENTS

| | | | |
|---|---|---|---|
| 4,309,721 | 1/1982 | Christopher | 358/128.5 |
| 5,245,606 | 9/1993 | DeSouza | 370/85.13 |
| 5,321,704 | 6/1994 | Erickson et al. | 371/37.1 |
| 5,745,503 | 4/1998 | Kuusinen | 371/37.1 |

FOREIGN PATENT DOCUMENTS 63-111730  5/1988  Japan .

OTHER PUBLICATIONS

Blahut, "Theory and Practice of Error Control Codes", Addison–Wesley Pub. Co., 1984, pp. 137–147, May 1984.

Sobski et al., "Parallel Encoder, Decoder, Detector, Corrector for Cyclic Redundancy Checking", ISCAS '92, vol. 6, pp. 2945–2948, Dec. 1992.

*Primary Examiner*—Stephen M. Baker
*Attorney, Agent, or Firm*—Leydig, Voit & Mayer, Ltd.

[57] ABSTRACT

When encoding data received by a dividing circuit and to be included in a CRC code word, the data is divided by a generator polynomial and remainder data resulting from the division is output from a plurality of parallel data output terminals of the dividing circuit. The remainder data is added to a CRC intrinsic value and "0" information in the adder to produce a sum. The sum is a CRC code for a CRC code word to be transmitted. When detecting code errors, data from a CRC code word is received by the dividing circuit, where the data is divided by the generator polynomial, and remainder data resulting from the division is output from the respective parallel data output terminals. The remainder data is added to the CRC intrinsic value and CRC code in the adder to produce a sum, and the sum is processed by a logical sum circuit to produce a logical sum output as a CRC flag. The CRC code generation and code error detection circuit generates CRC codes to be included in CRC code words at high speed and detects errors in received CRC code words at high speed.

14 Claims, 10 Drawing Sheets

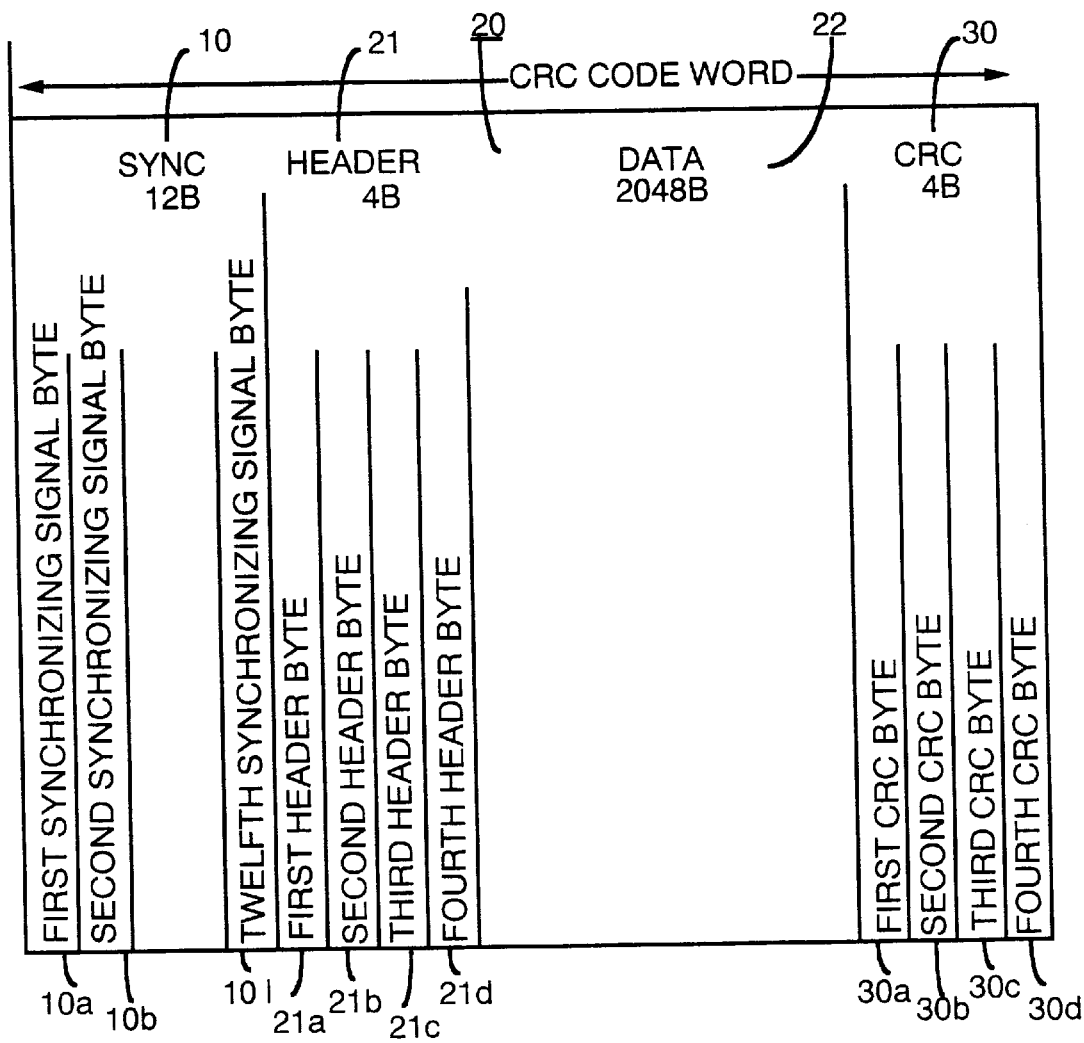
FIG. 5
FIG. 6A
CRC CODE WORD
FIG. 6B
CLOCK SIGNAL clk
FIG. 6C
DATA INPUT SIGNAL enbl

CRC CODE GENERATION CIRCUIT, CODE ERROR DETECTION CIRCUIT AND CRC CIRCUIT HAVING BOTH FUNCTIONS OF THE CRC CODE GENERATION CIRCUIT AND THE CODE ERROR DETECTION CIRCUIT

BACKGROUND OF THE INVENTION

1. Field of the invention

The present invention relates to a CRC code generation circuit, a code error detection circuit and a CRC circuit used in CD-ROM MODE 1 or CD-ROM MODE 2, for example, in the field of communication or storage media. More specifically, the present invention relates to a CRC code generation circuit for generating a CRC (Cyclic Redundancy Check) code or an EDC (Error Detection Code) code (hereinafter, these codes are referred to generally as an error detection code (CRC code)), a code error detection circuit for detecting an error using the CRC code, and a CRC circuit which functions both as a CRC code generation circuit and a code error detection circuit.

2. Description of the prior art

A CRC code word used in CD-ROM MODE 1 consists of a fixed pattern for synchronization, data following this pattern, and an error detection code (CRC code) which is added to the fixed pattern and the data.

Japanese Patent publication No. 4-81896 discloses a decode error detection circuit for detecting a code error, in which the CRC code word is regarded as one block. The error detection circuit disclosed in this publication comprises a dividing circuit consisting of a shift register to which data in a CRC code word and CRC code are input, a NOR circuit which receives an output from the dividing circuit and outputs a signal indicating "no error" when all the bits in the result from the dividing circuit are "0", and a signal indicating "error" when even one bit is "1", and an initial setting means for setting the initial state of a register, constituting the dividing circuit, to the same state as when the fixed pattern of the CRC code is input sequentially.

SUMMARY OF THE INVENTION

An object of the invention is to provide a CRC code generation circuit for generating a CRC code for a CRC code word at a high speed according to data for the CRC code word.

Another object of the invention is to provide a CRC code generation circuit for generating a CRC code for a CRC code word at high speed, accurately, although the CRC code word is input in synchronization with a clock signal, but data is input intermittently, i.e., data is not input for every pulse of the clock signal.

Another object of the invention is to provide a CRC code generation circuit for outputting the CRC code serially.

Another object of the invention is to provide a code error detection circuit for detecting a code error in a CRC code word at a high speed.

Another object of the invention is to provide a code error detection circuit for detecting a code error in a CRC code word at high speed, accurately, even if the CRC data is input intermittently.

Another object of the invention is to provide a code error detection circuit for outputting a decoded CRC code for a CRC code word when the CRC code word contains an error.

Another object of the invention is to provide a CRC circuit for generating a CRC code for a CRC code word and detecting a code error in the CRC code word at a high speed.

Another object of the invention is to provide a CRC circuit for generating a CRC code in a CRC code word at a high speed, accurately, and detecting a code error in the CRC code word at a high speed, accurately, even if the data is input intermittently.

Another object of the invention is to provide a CRC circuit for outputting the CRC code serially.

A further object of the invention is to provide a CRC circuit for outputting a decoded CRC code in a CRC code word if the CRC code word contains an error.

According to one aspect of the invention, a CRC code generation circuit used for CRC code word comprises a dividing circuit and an adder.

The dividing circuit receive data having a plurality of bits for a CRC code word input from a data input terminal, multiplies the input data by $X^r$, divides the product by a generator polynomial g(X) of a CRC code word, and outputs the result of the division as a remainder having r bits.

The adder adds the remainder from the dividing circuit and an intrinsic value (CRC intrinsic value) having r bits, which is derived from a fixed pattern of the CRC code word and the number of the CRC code word, except the fixed pattern, and outputs the sum as an encoded CRC code for the CRC code word for the data input into the dividing circuit.

According to another aspect of the invention, a code error detection circuit for detecting a code error in a CRC code word comprises a dividing circuit and a flag output means.

The dividing circuit receives data having a plurality of bits for a CRC code word input from a data input terminal, multiplies the input data by $X^r$, divides the product by a generator polynomial g(X) of a CRC code word, and outputs the result of the division from r parallel data output terminals as remainder having r bits.

The flag output means outputs a CRC flag indicating correct/error of the CRC code word for data input into the dividing circuit according to the remainder from the dividing circuit and a CRC intrinsic value.

According to further aspect of the invention, a CRC circuit which operates as a CRC code generation circuit and a code error detection circuit comprises a dividing circuit, an adder, and a logical sum circuit.

The dividing circuit receives data having a plurality of bits for a CRC code word input from a data input terminal, multiplies the input data by $X^r$, divides the product by a generator polynomial g(X) of a CRC code word, and outputs the result of the division from r parallel data output terminals as a remainder having r bits.

When encoding, the adder adds the remainder from the r parallel data output terminals of the dividing circuit and a CRC intrinsic value, and outputs the sum as an encoded CRC code for the CRC code word for the data input into the data input terminal of the dividing circuit.

When a code error is detected, the adder adds the remainder from the r parallel terminals of the dividing circuit, a CRC code for the CRC code word for the data input to the data terminal of the dividing circuit, and the CRC intrinsic value.

The logical sum circuit calculates a logical sum of a sum from the adder and outputs a calculated result as a CRC flag when a code error is detected.

According to further aspect of the invention, a CRC circuit which operates as a CRC code generation circuit and a code error detection circuit comprises a dividing circuit, an adder, and a flag output means.

When encoding, the dividing circuit receives data having a plurality of bits for a CRC code word input from a data input terminal, multiplies the input data by $X^r$, divides the product by a generator polynomial g(X) of a CRC code word, and outputs the result of the division from a serial data output terminal as a remainder having r bits.

When a code error is detected, the dividing circuit receives data having a plurality of bits for the CRC code word, multiplies the input CRC code word by $X^r$, divides the product by the generator polynomial g(X) of the CRC code word, and outputs the result of the division from r parallel data output terminals as a remainder having r bits.

The adder adds the remainder from the serial data output terminal of the dividing circuit and a CRC intrinsic value, and, when encoding, the adder serially outputs the sum as an encoded CRC code for the CRC code word for the data input into the data input terminal of the dividing circuit.

The flag output means comprises an adder and a logical sum circuit. When a code error is detected, the adder adds the CRC intrinsic value, the remainder from parallel data output terminals of the dividing circuit, and a CRC code in the CRC code word for the data input from the data input terminal of the dividing circuit. The logical sum circuit calculates a logical sum of a sum from the adder and outputs the calculated result as a CRC flag.

According to still further aspect of the invention, a CRC circuit which operates as a CRC code generation circuit and a code error detection circuit comprises a dividing circuit, an adder, a flag output means, an input-side logic circuit, and a first switching means.

The dividing circuit comprises data input terminal, a serial data output terminal for serially outputting remainder having a plurality of bits. The remainder is calculated by multiplying a CRC code word except a fixed pattern input from the data input terminal by $X^r$, dividing the product by a generator polynomial g(X) of a CRC code word, a plurality of parallel data output terminals outputting the remainder in parallel, and a plurality of stages of storage means corresponding to the plurality of parallel data output terminals.

The adder adds the remainder from the serial data output terminal of the dividing circuit and a CRC intrinsic value. When encoding, the adder outputs the sum as an encoded CRC code for the CRC code word for data input into the data input terminal of the dividing circuit.

The flag output means outputs a CRC flag indicating correct/error of a CRC code word input from the second data input terminal of the dividing circuit when a code error is detected, according to the remainder from the parallel data output terminals of the dividing circuit and the CRC intrinsic value.

The respective storage means are classified in a first group or a second group according to the generator polynomial g(X) of the CRC code word.

Each of the storage means in the first group comprises a first input node, a second input node, and an output node which is connected to a corresponding parallel data output terminal; a logic circuit for calculating an exclusive logical sum between the data input to the first and second input nodes; and a storage portion comprising an input node A0 for receiving an output from the logic circuit, an input node B0, an output node C0, and a selective input node, a selector for outputting either data input from the input node A0 or a data input from the input node B0 to the output node C0 according to a data input control signal input to the selective input node, and a storing circuit for receiving an output from the output node C0 of the selector in synchronization with an input clock signal, for storing the received content, and for outputting the content to the output node and the input node B0 of the selector.

Each of the storage means in the second group comprises: a first input node and an output node connected to a corresponding parallel data output terminal; a storage portion comprising an input node A0 for receiving data input in the first node, an input node B0, an output node C0, and a selective input node, a selector for outputting either data input from the input node A0 or data input from the input node B0 to the output node C0 according to a data input control signal input to the selective input node, and a storing circuit for receiving an output from the output node C0 of the selector in synchronization with an input clock signal, for storing the received content, and for outputting the content to the output node and the input node B0 of the selector.

The first input node of each stage of the storage means, other than the first stage, is connected to the output node of the storage means of the preceding stage.

The input-side logic circuit calculates an exclusive logical sum between data input from the data input terminal and data from the output node of the storage means of the last stage, and outputs a calculated result to the serial data output terminal.

The first switching means arranged between the output node of the input-side logic circuit and the first input node of the first-stage storage means and the second input nodes of the respective storage means in the first group, is connected to the output node of the input-side logic circuit to the first input node of the first-stage storage means and the second input nodes of the respective storage means in the first group while the dividing circuit performs division operation, and provides "0" information with the first input node of the first-stage storage means and the second input nodes of the respective storage means in the first group when a remainder is output from the serial data output terminal.

BRIEF DESCRIPTION OF THE DRAWINGS

FIG. 5 is a diagram showing a construction of a CRC code word shown in FIG. 4.

FIG. 6 is a simplified timing diagram for explaining the relationship between the CRC code word, the clock signal "clk", and the data input control signal "enb1" according to the first and third embodiments of the present invention.

DETAILED DESCRIPTION OF THE PREFERRED EMBODIMENTS

Embodiment 1.

A first embodiment of the present invention is explained using FIG. 1–FIG. 6. Before explaining a CRC circuit of the first embodiment which operates as a CRC code generation circuit and also as a code error detection circuit, a CRC code word which is used in the CD-ROM MODE 1 in this first embodiment is explained, using FIG. 4 and FIG. 5. The output from a dividing circuit in the CRC circuit of the first embodiment comprises 32 bits, for example.

Figure 4:
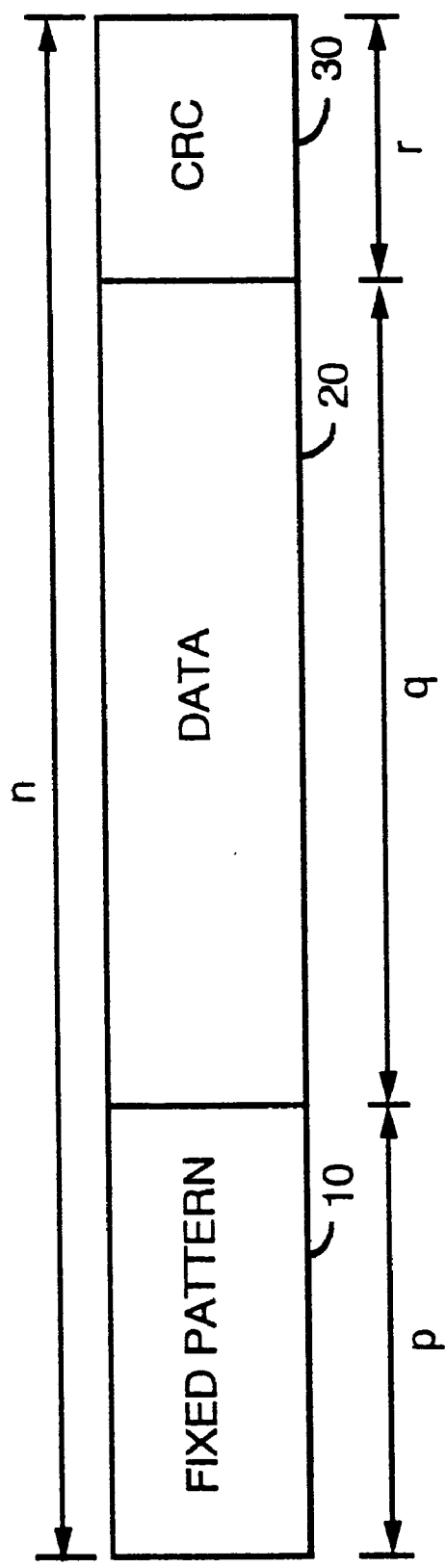
FIG. 4 is a data format diagram showing a CRC code word in the CD-ROM MODE 1 applied to the present invention.

In FIG. 4, a fixed pattern 10 for synchronization has a fixed data length p. As shown more specifically in FIG. 5, the fixed pattern 10 comprises twelve synchronizing signal bytes 10a, 10b, . . . , 10l, each byte consisting of 8 bits. This fixed pattern 10 is transmitted in the order from the first synchronizing signal byte 10a to the 12th synchronization signal byte 10l, and each byte is transmitted in the order from 0th bit, i.e., a least significant bit (LSB) to the seventh bit, i.e., a most significant bit (MSB).

Data 20 has an information data length q. As shown more specifically in FIG. 5, the data 20 consists of a header 21 and data 22. The header 21 comprises 4-header bytes 21a, 21b, . . . , 21d, each byte comprising 8 bits. The data 22 comprises 2048 bytes, each byte comprising 8 bits. The data 20 is transmitted after the synchronizing signal 10 from the header 21 to the data 22. The header 21 is transmitted from the first header byte 21a to the fourth header byte 21d, and each byte is transmitted from the 0th bit to the seventh bit. The data 22 is transmitted from the first byte to the 2048th byte, and each byte is transmitted from the 0th bit to the seventh bit.

A CRC code 30 has a CRC code length r. As shown more specifically in FIG. 5, the CRC code 30 comprises CRC code bytes, each byte comprising 8 bits. This CRC code 30a is constructed so that the CRC code word will cause the division result to be zero using the fixed pattern 10 and the data 20. This CRC code 30 is transmitted after the data 20 from the first CRC detection signal byte 30a to the fourth CRC detection signal byte 30d, and each byte is transmitted from the 0th bit to the seventh bit.

The CRC code word, comprising the fixed pattern 10, the data 20, and the CRC code 30, has a code word length n (=p+q+r) in the CD-ROM MODE 1.

The CRC code constituted in this way satisfies the following conditional equation. In other words, the polynomial g(x) of the CRC code word defined in a technical standard is obtained so that the remainder is zero when the transmission code word polynomial T(x) of the CRC code word is divided by the polynomial g(x), as shown by the following equation (1).

$$g(X)=X^{32}+X^{31}+X^{16}+X^{15}+X^{4}+X^{3}+X+1 \quad (1)$$

On the other hand, the transmission code word polynomial T(x) of the CRC code word is shown by the following equation (2).

$$T(X)=F(X)\cdot X^{(q+r)}+I_1(X)\cdot X^r+C_1(X) \quad (2)$$

where, F(X) is a fixed pattern polynomial, $I_1(X)$ is a data polynomial, and $C_1(X)$ is a CRC code polynomial, n is a code word length, p is a fixed data length, q is an information data length, and r is a CRC code length.

Since T(X) is shown by a following equation (3), the equation (2) is shown by equation (4).

$$T(X) \bmod g(X)=0 \quad (3)$$

$$\{F(X)\cdot X^{(q+r)}+I_1(X)\cdot X^r+C_1(X)\} \bmod g(X)=0 \quad (4)$$

The equation (3) shows that the remainder is zero when the transmission code word polynomial T(X) is divided by the generator polynomial g(X).

The following equations (5) and (6) are transformations of the equation (4), and as a result of the transformations, equation (7) is obtained.

$$\{F(X)\cdot X^{(q+r)}+I_1(X)\cdot X^r\} \bmod g(X)+C_1(X) \bmod g(X)=0 \quad (5)$$

$$C_1(X) \bmod g(X)=\{F(X)\cdot X^{(q+r)}+I_1(X)\cdot X^r\} \bmod g(x) \quad (6)$$

$$C_1(X) \bmod g(x)=F(X)\cdot X^{(q+r)} \bmod g(X)+I_1(X)\cdot X^r \bmod g(X) \quad (7)$$

As is clear from the equation (7), the left member $[C_1(X) \bmod g(X)]$ of the equation (7) represents a CRC code for a CRC code word for transmission.

The first term $[F(X)X^{(q+r)} \bmod g(X)]$ in the right member of equation (7) represents an intrinsic value derived from the fixed pattern 10 and a code length (the number of bits) (q+r) in a CRC code word except the fixed pattern (hereinafter, referred to as a CRC intrinsic value).

The second term $[I_1(X)X^r \bmod g(X)]$ in the right member of the equation (7) represents a remainder resulting from dividing the product of the information data polynomial $I_1(X)$ and $X^r$, by the CRC generator polynomial g(X), in other words, a remainder of the data. The second term in the right member of the equation (7) represents the remainder obtained by dividing the data for the CRC code word and the "0" data having the same number of bits as the code length r of the CRC code, by the CRC generator polynomial g(X).

Accordingly, the CRC code for the CRC code word for transmission is obtained by multiplying the CRC code word data by $X^r$ to produce a product, then dividing the product by the CRC generation polynomial g(X), and adding a CRC intrinsic value to the result of the division (a remainder).

Since the CRC intrinsic value comprises respective standardized values for the fixed pattern 10 and the respective code lengths p, q, and r, in a CRC code word, the CRC intrinsic value has a predetermined value, for example, 32 bits is the same as the code length r of the CRC code in this first embodiment, regardless of the data 20.

On the other hand, the received code word polynomial R(X) of a CRC code word is shown by the following equation (8).

$$R(X)=F(X)\cdot X^{(q+r)}+I_2(X)\cdot X^r+C_2(X) \quad (8)$$

where F(X) is a fixed pattern polynomial, $I_2(X)$ is a data polynomial, $C_2(X)$ is a CRC code polynomial, n is a code word length, p is a fixed data length, q is an information data length, and r is a CRC code length.

A decoded CRC code of the CRC code word is obtained by dividing the received code word polynomial R(X) by the generator polynomial g(X) for the CRC code word. Assuming the decoded CRC code polynomial of a decoded CRC code is DC(X), the following equation (9) is obtained.

Since the generator polynomial g(X) for the standardized CRC code word is defined so that the remainder obtained by dividing the received code word polynomial R(X) of the CRC code by the generator polynomial g(X) is zero, the decoded CRC code polynomial DC(X) becomes zero if there is no error in the received CRC code word.

$$DC(X)=R(X) \bmod g(X) \quad (9)$$

The following equation (10) is obtained by substituting the equation (8) into equation (9). Equation (11) and equation (12) are obtained by transforming equation (10).

$$DC(X)=\{F(X)\cdot X^{(q+r)}+I_2(X)\cdot X^r+C_2(X)\} \bmod g(X) \qquad (10)$$

$$DC(X)=F(X)\cdot X^{(q+r)} \bmod g(X)+\{I_2(X)\cdot X^r+C_2(X)\} \bmod g(X) \qquad (11)$$

$$DC(X)=F(X)\cdot X^{(q+r)} \bmod g(X)+I_2(X)\cdot X^r \bmod g(X)+C_2(X) \bmod g(X) \qquad (12)$$

As is clear from equation (11), the first term $[F(X)X^{(q+r)} \bmod g(X)]$ in the right member of the equation (11) represents an intrinsic value (hereinafter, referred to as a CRC intrinsic value) derived from the fixed pattern 10 and a code length (the number of bits) (q+r) in a CRC code word, except for the fixed pattern.

The second term $[\{I_2(X)X^r+C_2(X)\} \bmod g(X)]$ in the right member of the equation (11) represents a remainder obtained by dividing the CRC code word, except the fixed pattern 10, by the CRC generator polynomial g(X), i.e., a remainder.

Accordingly, the decoded CRC code polynomial DC(X) for the decoded CRC code in the received CRC code word is obtained by dividing the CRC code word, except for the fixed pattern 10, by the CRC generator polynomial g(X), and adding the CRC intrinsic value to the division result (a remainder).

If there is no error in the received CRC code word, the decoded CRC code polynomial DC(X) is zero, and the sum with the division result of the CRC code word, except for the fixed pattern 10 (the remainder) to the CRC intrinsic value is zero. In other words, the result obtained by dividing the CRC code word, except the fixed pattern 10 (the remainder), by the CRC generator polynomial g(X) has the same value as that of the CRC intrinsic value.

As is clear from the equation (12), the first term $[F(X)X^{(q+r)} \bmod g(X)]$ in the right member of the equation (12) represents the CRC intrinsic value.

The second term $[\{I_2(X)X^r \bmod g(X)\}]$ in the right member of equation (12) represents the remainder resulting from dividing the product of the information data polynomial $I_1(X)$ and $X^r$, by the CRC generator polynomial g(X).

The third term $[C2(X) \bmod g(X)]$ in the equation (12) represents a CRC code itself in the received CRC code word.

Accordingly, the decoded CRC code polynomial DC(X) for the decoded CRC code in the received CRC code word is obtained by multiplying the CRC code word data by $X^r$, then dividing the multiplied result by the CRC generation polynomial g(X), and adding the CRC intrinsic value and the CRC code in the received CRC code word to the division result (a remainder).

If there is no error in the received CRC code word, the decoded CRC code polynomial DC(X) is zero, and with the addition of the result (a remainder), obtained by dividing the product of the received CRC code word data and $X^r$ by the CRC generator polynomial g(X), the CRC intrinsic value, and the CRC code for the received CRC code word is zero.

Figure 1:
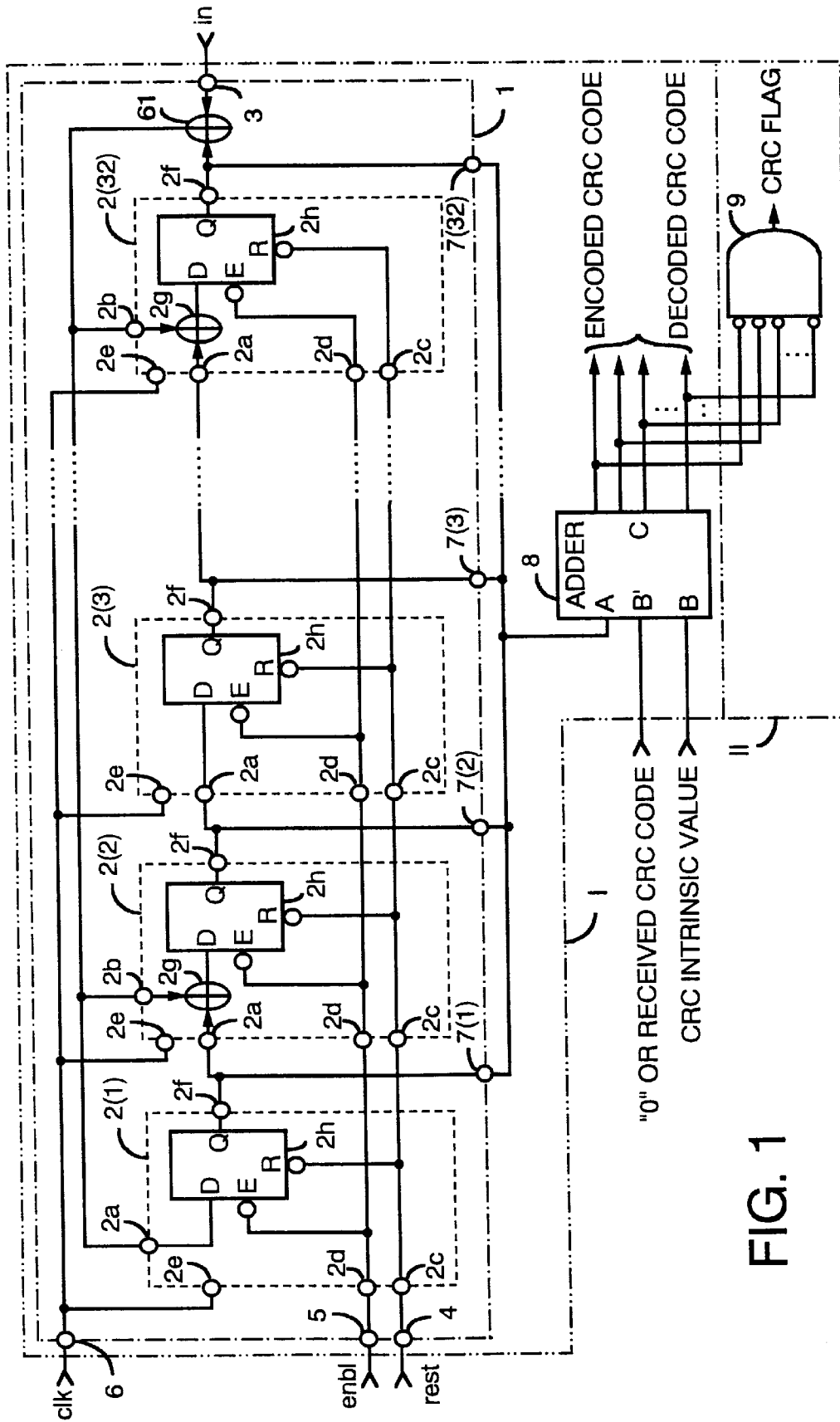
FIG. 1 is a circuit configuration diagram showing a first embodiment of the present invention.
Figure 2:
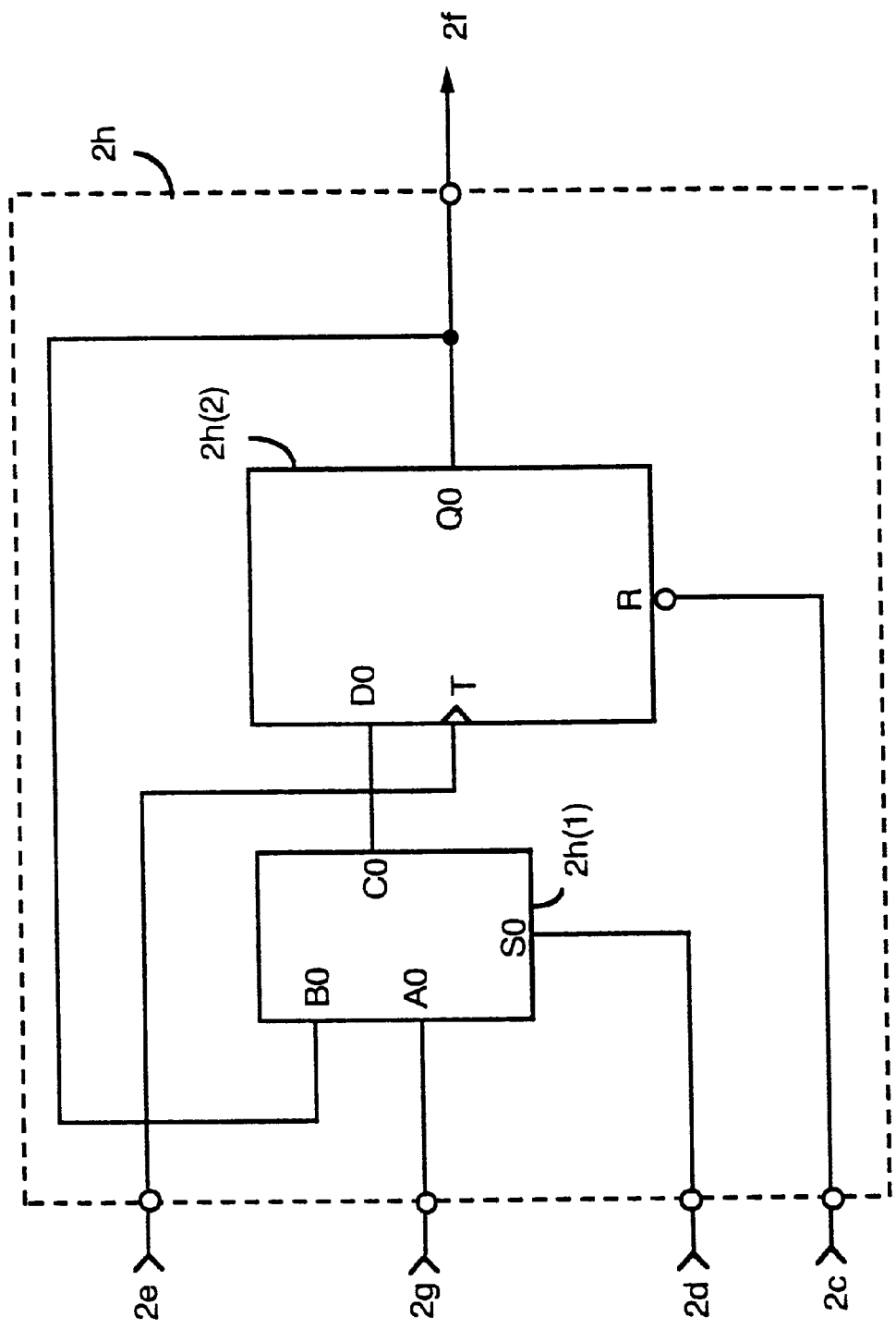
FIG. 2 is a block diagram showing a storage portion 2h in each of the storage devices 2(1)–2(32) according to the first embodiment and a third embodiment of the present invention.

A CRC circuit which operates as a CRC code generation circuit for generating the CRC code word and a code error detection circuit for detecting a code error in the CRC code word is explained, referring to FIG. 1 and FIG. 2.

Figure 3:
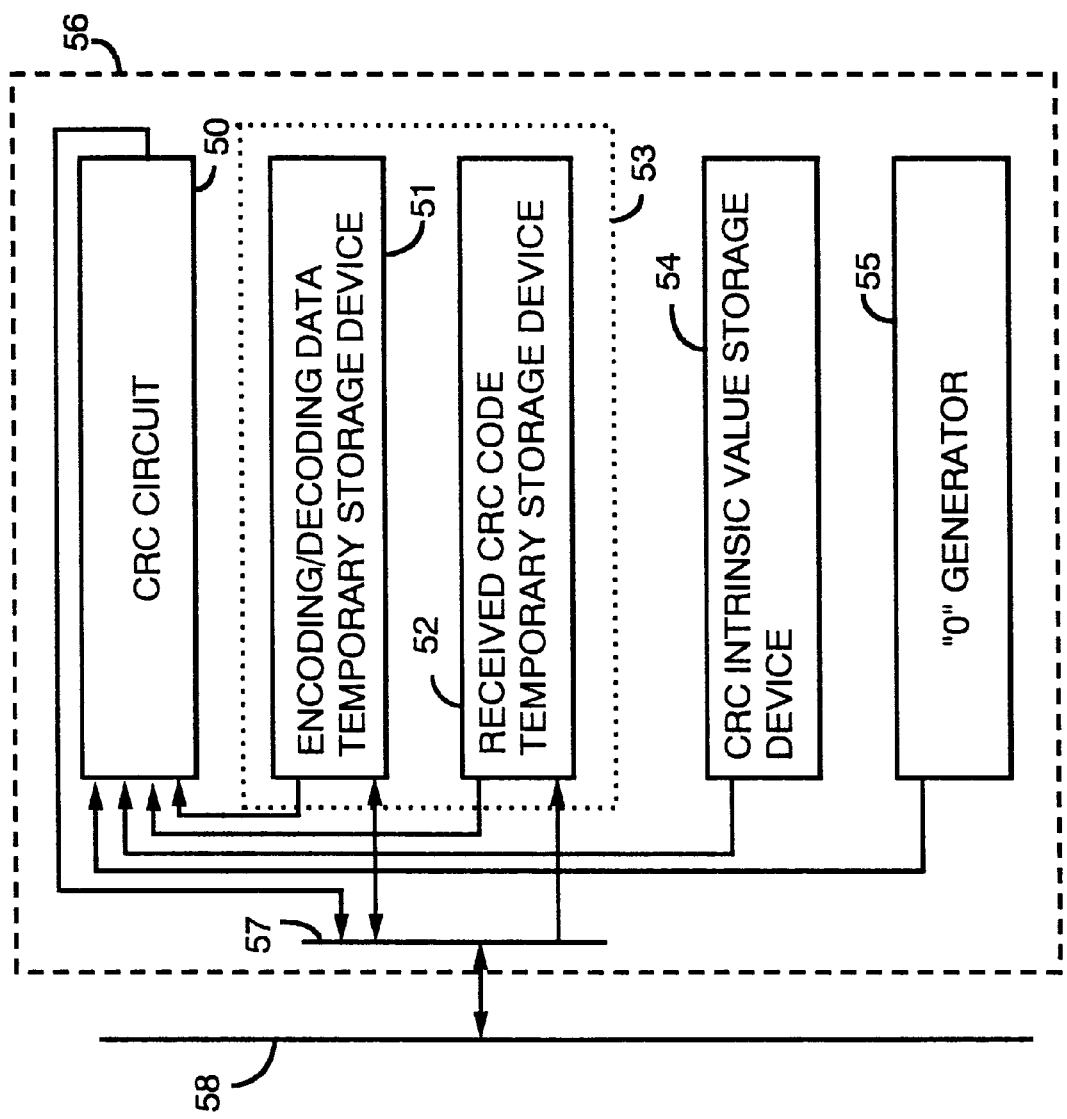
FIG. 3 is a block diagram showing an encoding/decoding system to which a CRC circuit shown in each of the embodiments of the present invention is applied.

FIG. 1 is a circuit configuration of a dividing circuit 1. In FIG. 1, in the encoding process, a CRC code word having a plurality of bits (hereinafter, referred to as an encoding input data in the first embodiment), comprising a fixed pattern having a plurality (p) of bits, data having a plurality (q) of bits, and a CRC code having a plurality (r, any integer greater 1) of bits as shown in FIG. 3 and FIG. 4, is input from a code data input terminal 3. The dividing circuit 1 then multiplies the input data by $X^r$, divides the resulting product by the generator polynomial g(X) (see equation (1)) of the CRC code word, and outputs the remainder resulting from the division as a remainder having r bits from parallel data output terminals 7(1)–7(32). When a code error is detected, data having a plurality of bits (hereinafter, referred to an input data at an error detection in the first embodiment) for the CRC code word is input from a code data input terminal 3. The dividing circuit 1 then multiplies the encoded input data by $X^r$, divides the input CRC code word by the generator polynomial g(X) of the CRC code word, and outputs the remainder resulting from the division as r bits remainder data from parallel data output terminals 7(1)–7(32).

The dividing circuit 1 comprises storage devices 2(1)–2(32) arranged in a plurality of stages (32 stages in this embodiment) which constitutes a shift register for dividing the CRC code word by the generator polynomial g(X) of the CRC code word. Each of the storage devices 2(1)–2(32) corresponds to one of the parallel data output terminals 7(1)–7(32).

This dividing circuit 1 further comprises an input-side logic circuit 61. The input-side logic circuit 61 calculates an exclusive logical sum of the data input from the input terminal 3 and the data from the output node 2f of the last-stage storage device 2(32). The calculated result is given to the first input node 2a of the first-stage storage device 2(1) and to the respective second input nodes 2b of the six storage devices 2(2), 2(4), 2(5), 2(16), 2(17), and 2(32) in the respective second, fourth, fifth, sixteenth, seventeenth, and thirty second stages of the first group.

The dividing circuit 1 further comprises the first and second input terminals 3a and 3b, and the parallel data output terminals 7(1)–7(32), as explained above. The dividing circuit 1 further comprises a reset signal input terminal 4 to which a reset signal "rest" for setting all the stored contents in the storage devices 2(1)–2(32) to the initial state, for example "0", is input. The dividing circuit 1 further comprises a data input control terminal 5 to which a data input control signal (enable signal) "enbl" indicating whether the storage devices 2(1)–2(32) operate as a shift register or as a storage device for maintaining data stored therein, is input. The dividing circuit 1 further comprises a clock signal input terminal 6 to which a clock signal "clk" for establishing the timing for receiving in the content to be stored in the storage devices 2(1)–2(32).

In this first embodiment, the encoding input data and the error detection input data are input into the code data input terminal 3 in synchronization with the clock signal "clk" as shown in FIG. 6B. The data is provided in the order of the 0th, the first, and the second bit, as shown in FIG. 6A. As shown in FIG. 6A and FIG. 6B, the respective 0th, first, fourth, and fifth bits are provided respectively within one clock period of the clock signal "clk", and the second and third bits are provided respectively within two periods of the clock signal "clk". However, the second data bit is not provided in the second period of the clock signal "clk", i.e., during the second and third bits. In other words, the data is dropped in this second clock period. In the present application, such data is referred to as intermittent data.

In this first embodiment, if the encoding input data input to the first input terminal 3 or the error detection input data input to the input terminal 3 are intermittent data, an "H"-level data input control signal "enbl" is provided to the data input control terminal 5 during the second period of the clock signal "clk" for the second and the third bits, as shown in FIG. 6C, indicating that data is dropped during this period.

The storage devices 2(1)–2(32) in a plurality of stages, which comprise the dividing circuit 1, are classified into first and second groups, according to the generator polynomial g(X) of the CRC code word, as shown by the equation (1). In this first embodiment, the six storage devices in the respective second, fourth, fifth, sixteenth, seventeenth, and thirty-second stages belong to the first group, and the storage devices in the other 26 stages belong to the second group.

Each of the storage devices belonging to the first group comprises first and second input nodes 2a and 2b, a reset signal input node 2c, connected to the reset signal input terminal 4, a data input control node 2d, connected to the data input control terminal 5, a clock signal input node 2e, connected to the clock signal input terminal 6, an output node 2f, connected to the corresponding parallel data output terminals 7(1)–7(32), a logic means 2g, consisting of an exclusive OR circuit, for calculating an exclusive logical sum of the data respectively input into the first and the second input nodes 2a and 2b, and a storage portion 2h.

The storage portion 2h is reset by a reset signal "rest" input into the reset signal input node 2d (in this first embodiment, the storage content becomes "0" ("L" level) in response an "L"-level of the reset signal "rest"), and it is activated by an "H"-level of the reset signal "rest". In an activated state, if the data input control signal "enbl" input into the data input control node 2d indicates that the storage portion 2h operates as a shift register (in this first embodiment, when it is in "L" level), the storage portion 2h constitutes a shift register.

In synchronization with the clock signal "clk" (in this first embodiment, in response to the rising of the clock signal "clk"), the storage portion 2h receives a calculated output from the logic means 2g, temporarily stores it, and then outputs the stored content to the output node 2f. If the data control input signal "enbl" indicates that the storage portion 2h maintains the data (in this first embodiment, it is in "H" level), the storage portion 2h maintains the data, and, in synchronization with the clock signal "clk" (in this first embodiment, in response to the rising edge of the clock signal "clk"), the storage portion 2h receives its own output, temporarily stores the output, and then outputs the stored content to the output node 2f.

Each of the storage devices belonging to the second group comprises a first input node 2a, a reset signal input node 2c connected to the reset signal input terminal 4, a data input control node 2d connected to the data input control terminal 5, a clock signal input node 2e connected to the clock signal input terminal 6, an output node 2f which is connected to the corresponding parallel data output terminals 7(1)–7(32), and a storage portion 2h.

The storage portion 2h is reset by a reset signal "rest" which is input into the reset signal input node 2d (in this first embodiment, the storage content becomes "0" ("L" level) in response to an "L"-level of the reset signal "rest"), and it is activated by an "H"-level of the reset signal "rest". In an activated state, if the data input control signal "enbl" input into the data input control node 2d indicates that the storage portion 2h operates as a shift register (in this first embodiment, it is in "L" level), the storage portion 2h constitutes a shift register.

In synchronization with the clock signal "clk" (in this first embodiment, in response to the rising edge of the clock signal "clk"), the storage portion 2h receives a calculated output from the first input node 2a, temporarily stores it, and then outputs the stored content to the output node 2f. If the data control input signal "enbl" indicates that the storage portion 2h maintains the data (in this first embodiment, it is in "H" level), the storage portion 2h maintains the data, and in synchronization with the clock signal "clk" (in this first embodiment, in response to the rising of the clock signal "clk"), the storage portion 2h receives its own output, temporarily stores the output, and then outputs the stored content to the output node 2f.

The first input node 2a of the first-stage storage device 2(1) is connected to the output node of the input-side logic circuit 61, and the respective first input nodes 2a of the storage devices 2(2)–2(32) in the second–thirty second stages are connected to the respective output nodes 2f of the storage devices 2(1)–2(31) in the respective preceding stage. The respective second input nodes 2b of the storage device of the first group, i.e., the seven storage devices 2(2), 2(4), 2(5), 2(16), 2(17), and 2(32) in the respective second, fourth, fifth, sixteenth, seventeenth, and thirty-second stages in this first embodiment, are connected to the output node of the input-side logic circuit 61.

The respective storage portions 2h of the storage devices 2(1)–2(32) comprise a selector 2h(1) and a flip-flop circuit 2h(2) which operates as a storing circuit, as shown in FIG. 2.

The selector 2h(1) in each of the storage devices belonging to the first group comprises a first input node A0 for receiving an output from the logic circuit 2g, a second input node B0, an output node C0, and a select input node S0 connected to the data input control node 2d. In this first embodiment, if the data input control signal "enbl" input into the select input node S0 is "L" level, the data input into the first input node A0 is output to the output node C0, and if the data input control signal "enbl" input into the select input node S0 is "H" level, the data input into the first input node B0 is output to the output node C0.

The selector 2h(1) in each of the storage device belonging to the second group comprises a first input node A0 for receiving data input into the first input node 2a, a second input node B0, an output node C0, and a select input node S0 connected to the data input control node 2d. In this first embodiment, if the data input control signal "enbl" input into the select input node S0 is "L" level, the data input into the first input node A0 is output to the output node C0, and if the data input control signal "enbl" input into the select input node S0 is "H" level, the data input into the first input node B0 is output to the output node C0.

The flip-flop circuit 2h(2) comprises an input node D0 connected to the output node C0 of the selector 2h(1), an output node Q0 connected both to the output node 2f and the input node B0 of the selector 2h(1), a reset signal input node R connected to the reset signal input node 2c, and a clock signal input node T connected to the clock signal input node 2e. In this first embodiment, if the reset signal is "L" level, the stored content in the flip-flop circuit 2h(2) becomes "0", and if the reset signal is "H" level, the flip-flop circuit 2h(2) is activated. In the activated state, the flip-flop circuit 2h(2) receives the selected output from the selector 2h(1) at the input node D0 and, in response to the rising edge of the clock signal "clk", temporarily stores it, and then outputs the stored content to the output node 2f via the output node Q.

Referring back to FIG. 1, an adder 8 adds the remainder from the respective r parallel data output terminals 7(1)–7(32) in the dividing circuit 1 and the CRC intrinsic value and "0" information when encoding or the received CRC code when decoding. When encoding, the adder 8 outputs the sum as an encoded CRC code for the CRC code word for the data input to the code data input terminal 3 of the dividing circuit 1 (hereinafter, referred to as an encoded CRC code). When a code error is detected, the adder 8 outputs the sum as a decoded CRC code from the CRC code word for the data input from the code data input terminal 3 of the dividing circuit 1 (hereinafter, referred to as a decoded CRC code).

The adder 8 is a three-input adder, comprising a first input terminal A for receiving the remainder data (in this first embodiment, 32-bit data) output from the respective parallel data output terminals 7(1)–7(32) of the dividing circuit 1, a second input terminal B for receiving the CRC intrinsic value (in this first embodiment, 32-bit data), a third input terminal B' for receiving "0" information when encoding, and a CRC code for the received CRC code word when a code error is detected, and an output terminal C for outputting both the sum and a decoded CRC code, which is also a sum. In case of encoding, when "0" is input to the third input terminal B', the adder 8 is substantially the same as a two-input adder comprising the first and second input terminals.

Moreover, when encoding, since encoding input data having a plurality of bits is input to the input terminal 3 in the dividing circuit 1, where it is multiplied by $X^r$, and divided by $g(X)$, the remainder from each of the parallel data output terminals 7(1)–7(32) of the dividing circuit 1 is expressed by the second term in the right member of the equation (7) $[I_1(X)X^r \bmod g(X)]$.

Accordingly, the remainder data from the parallel data output terminals 7(1)–7(32) and the CRC intrinsic value expressed by the first term $[F(X)X^{(q+r)} \bmod g(X)]$ of the right member of equation (7), are input into the adder 8. The first term $[C_1(X) \bmod g(X)]$ of the left member of equation (7) is output from the output terminal of the adder 8, which indicates a CRC code for the CRC code word to be transmitted (an encoded CRC code).

When a code error is detected, since error detection input data, consisting of data having a plurality of bits and a CRC code of r bits, is input to the second input terminal 3a of the dividing circuit 1, the remainder from each of the parallel data output terminals 7(1)–7(32) of the dividing circuit 1 is expressed by the second term $[\{I_2(X)X^r + C_2(X)\} \bmod g(X)]$ in the right member of equation (11).

Accordingly, the remainder from the parallel data output terminals 7(1)–7(32) and the CRC intrinsic value expressed by the first term $[F(X)X^{(q+r)} \bmod g(X)]$ of the right member of the equation (11), and a CRC code the received CRC code word, expressed by the third term $[C_2(X) \bmod g(X)]$ of the right member of equation (12), are input into the adder 8. The $DC(X)$ of the left member of equation (12) is output from the adder 8, and indicates a decoded CRC code from the received CRC code word (a decoded CRC code).

A logical sum circuit 9 receives a sum from the output terminal of the adder 8, calculates a logical sum of the received sums, and then outputs the logical sum as a CRC flag. The logical sum circuit 9 and the adder comprise a flag output means for outputting a CRC flag indicating the correct CRC code word or an error in the CRC code word for the data input to the dividing circuit 1, according to the remainder and the CRC intrinsic value from the dividing circuit 1 and the CRC code in the received CRC code word.

The logical sum circuit 9 outputs an "H"-level CRC flag in this first embodiment, indicating no error in the CRC code word, when the decoded CRC code polynomial DC (X) is 0, in other words, the sum from the adder 8 is 0, meaning the received CRC code word indicates no error. If there is an error, the output logical sum circuit 9 outputs an "L"-level CRC flag (a comparison result signal) which indicates a CRC code word error in this first embodiment, since at least one bit in the sum from the adder 8 is 1.

The dividing circuit 1 and the adder 8 comprise a CRC code generator circuit I, and the dividing circuit 1, the adder 8 and the logical sum circuit 9 comprise a code error detection circuit II.

A CRC circuit having a configuration as mentioned above is integrated into an encoding/decoding system, as shown in FIG. 3.

In FIG. 3, a CRC circuit 50 is the same as that shown in detail in FIG. 1. An encoding/decoding data temporary storage device 51 stores data having a plurality of bits in the CRC code word, which is transmitted to the CRC circuit 50. A fixed pattern having a plurality of bits and a CRC code having a plurality of bits generated in the CRC circuit 50 are synthesized into a CRC code word, and then transmitted to the other systems via an internal bus 57 and an external bus 58, when encoding. The encoding/decoding data temporary storage device 51 stores data having a plurality of bits in the encoding/decoding data temporary storage device, which is input via the external bus 58 and the inside bus 57, and transmits the stored data to the CRC circuit 50, when detecting an error code.

A received CRC code temporary storage device 52 stores a CRC code having a plurality of bits for the CRC code word, input via the external bus 58 and the internal bus 57, and transmits the stored data to the CRC circuit 50. The encoding/decoding data temporary storage device 51 and the received CRC code temporary storage device 52 constitute a CRC code word storage device 53, which comprises, for example a DRAM, an SRAM, or a FIFO memory.

A CRC intrinsic value storage device 54 stores the CRC intrinsic value, and transmits the CRC intrinsic value to the CRC circuit 50. The CRC intrinsic value storage device 54 outputs, in parallel, the CRC intrinsic value having a plurality of bits (in this first embodiment, 32 bits), and consists of a ROM which can store the CRC intrinsic value in a "setable" state.

A "0" generator 55 transmits "0" information, which consists of a plurality of bits (in this first embodiment, 32 bits), to the CRC circuit 50. In synchronization with a clock signal input to the CRC circuit 50, the "0" generator 55 outputs a plurality of "L"-level bits (in this first embodiment, ground potential).

An encoding/decoding system 56 comprises the CRC circuit 50, the encoding/decoding data temporary storage device 51, the encoding CRC code temporary storage device 52, the CRC intrinsic value storage 53, the CRC intrinsic value storage device 54, and the "0" generator 55.

The operation of the CRC circuit having this configuration is explained below, respectively, with regard to encoding, and code error detection.

[Encoding]

Before generating a CRC code, an "L"-level of the reset signal "rest" is applied to the reset signal input terminal 4 of the dividing circuit so that all the content stored in the respective flip-flop circuits 2h(2) of the respective storage portions 2h, in the all storage devices 2(1)–2(32) are reset, in other words, initialized to "0".

All contents of the storage devices 2(1)–2(32) in the dividing circuit 1 are initialized and then the respective reset signals are set to "H" level.

In this set state as shown in FIG. 6A, data having a plurality of bits for the CRC code word, which is temporarily stored in the encoding/decoding data temporary storage device 51, is provided to the code data input terminal 3 of the dividing circuit 1 in synchronization with the clock signal "clk" shown in FIG. 6B.

Referring to FIG. 5, the data for the CRC code word is input into the code data input terminal 3 of the dividing circuit 1 from the first header byte 21a to the fourth header byte 21d in the header portion 21. The bits are input, from the 0th bit to the seventh bit. The data portion 22 is then input following the header portion 21, from the first byte to the 2048th byte, and, in each byte, the bits are input from the 0th bit to the seventh bit.

The data having a plurality of bits for the CRC code word, is received by the dividing circuit 1 according to the data input control signal "enbl" input into the data input control terminal 5 and the clock signal "clk" is input into the clock signal input terminal 6. The data for the CRC code word is divided by the g(X) and the remainder resulting from the division is output from the parallel data output terminals 7(1)–7(32) in the division circuit 1.

This point is further elaborated as follows. The data input control signal "enbl" input into the data input control terminal 5 maintains "L" level as long as there is no data dropped in the data for the CRC code word which is input into the code data input terminal 3. For example, the signal "enbl" is "L" level in the respective periods for the 0th, first, fourth, and fifth bits of the input data, and in the first clock period of the respective periods for the second and the third input bits. Therefore, the selector $2h(1)$ in the storage portion $2h$ in each of the storage devices 2(1)–2(32) selects the outputs from the logic circuit $2g$.

Accordingly, during these periods, each of the storage devices 2(1)–2(32) in the dividing circuit 1 operates as a shift register. The respective flip-flop circuits $2h(2)$ in the respective storage portions $2h$ receive either the output signal via the selector $2h(1)$ from the respective logic circuit $2g$ or the information from the first input node $2a$, in synchronization with the rising edge of the clock signal "clk" input to the clock signal input terminal 6. The respective flip-flop circuits $2h(2)$ temporarily store the contents, and at the same time, output the data to be stored to the respective corresponding parallel data output terminals 7(1)–7(32).

The input-side logic circuit 61 receives the data for the CRC code word, input to the code data input terminal 3, calculates an exclusive logical sum between the input data and the data from the output node $2f$ of the last-stage storage device 2(32), and outputs the calculated result to the first input node $2a$ of the first-stage storage device 2(1) and the respective second input nodes $2b$ of the six storage devices 2(2), 2(4), 2(5), 2(16), 2(17), and 2(32) in the respective second, fourth, fifth, sixteenth, seventeenth, and thirty-second stages, which are in the first group.

The storage portion $2h$ in the storage device 2(1) in the first stage directly receives the output from the input-side logic circuit 61.

The logic circuit $2g$ in each storage device belonging to the first group, except the logic circuit in the first-stage storage device 2(1), calculates an exclusive logical sum between the output signal from the storage portion $2h$ in the preceding storage device and the output from the input-side logic circuit 61. The logical sum is then output to the storage portion $2h$ in each corresponding storage device.

The storage portion $2h$ in each storage device in the second group, except the storage portion in the first-stage storage device 2(1), receives directly the output from the storage portion $2h$ in the preceding storage device.

On the other hand, if there is data dropped in the data input into the code data input terminal 3, the data input control signal "enbl" input into the data input control terminal 5 maintains "H" level. For example, the signal "enbl" becomes "H" level in the respective second clock periods corresponding to the second and the third bits in the input data, as shown in FIG. 6A and FIG. 6C. The "H"-level data input control signal "enbl" operates so that the selector $2h(1)$ in the storage portion $2h$ in the respective storage devices 2(1)–2(32) selects the outputs from the flip-flop circuit $2h(2)$ in its own storage portion $2h$.

Accordingly, each of the storage devices 2(1)–2(32) in the dividing circuit 1 operates so that it maintains its own stored content. That is, as shown in FIG. 2, since the flip-flop circuit $2h(2)$ receives the output signal from output terminal of its own storage portion $2h$ via the selector $2h(1)$, in synchronization with the rise of the clock signal input into the clock signal input terminal 6, the flip-flop circuit $2h(2)$ in each of the storage devices 2(1)–2(32) maintains its stored content.

In this way, the dividing circuit 1 divides the data for the CRC code word by g(X) and outputs the remainder resulting from the division to the respective parallel data output terminals 7(1)–7(32) of the dividing circuit 1.

The remainder data output from the respective parallel data output terminals 7(1)–7(32) is input into the input terminal A of the adder 8, which adds the remainder to the CRC intrinsic value input to the second input terminal B.

The "0" information is input to the third input terminal B'. As a result, the remainder input to the first input terminal A and the CRC intrinsic value input to the second input terminal B are added. Therefore, the output from the adder 8 has a value derived from the equation (7), and constitutes a CRC code for the CRC code word to be transmitted (encoded CRC code). This encoded CRC code is then synthesized with a fixed pattern having a plurality of bits for the corresponding CRC code word and data stored in the encoding/decoding data temporary storage device 51, and transmitted to the other systems via the internal bus 57 and the external bus 58 as a CRC code word.

[Detecting code errors]

Before detecting code errors in transmitted CRC code words, an "L"-level of the reset signal "rest" is applied to the reset signal input terminal 4 in the dividing circuit 1 so that all the content stored in the flip-flops $2h(2)$ in the storage portions $2h$ in the respective storage devices 2(1)–2(32) in the dividing circuit 1 are reset, i.e., initialized to "0".

All the storage devices 2(1)–2(32) in the dividing circuit 1 are initialized, and then respective reset signals are set to "H" level.

On the other hand, the data from the CRC code word transmitted via the external bus 58 and the internal bus 57 is temporarily stored in the encoding/decoding data temporary storage device 51, and the CRC code in the CRC code word is temporarily stored in the received CRC code temporary storage device 52.

As shown in FIG. 6A, in the "set" state of the respective storage devices 2(1)–2(32), the data in the CRC code word, which is temporarily stored in the encoding/decoding data temporary storage device 51, is provided to the code data input terminal 3 of the dividing circuit 1 in synchronization with the clock signal "clk" shown in FIG. 6B.

Referring to FIG. 5, the data from the CRC code word is input into the code data input terminal 3 of the dividing circuit 1, from the first header byte 21a to the fourth header byte 21d of the header portion 21, and the bits are input from the 0th bit to the seventh bit. The data portion 22 is then input following the header portion 21 from the first byte to the 2048 th byte, and in each byte, the bits are input from the 0th bit to the seventh bit.

The data from the CRC code word, is input as mentioned above, is received by the dividing circuit 1 according to the data input control signal "enbl", input into the data input control terminal 5, and the clock signal "clk" input into the clock signal input terminal 6. The data from the CRC code word is then divided by g(X) and the remainder is output from each of the parallel data terminals 7(1–7(32) in the division circuit 1, in the same manner as in the encoding process.

The remainder data output from the respective parallel data output terminals 7(1)–7(32) of the dividing circuit 1 is input to the first input terminal A of the adder 8 which adds the input remainder, the CRC intrinsic value input to the second input terminal B, and the CRC code from the received CRC code word input to the third input terminal B', i.e., the CRC code temporarily stored in the received CRC code temporary storage device 52.

The output from the adder 8 has a value derived from equation (12). The output resulting from the addition is then input to the logical sum circuit 9, where a logical sum is calculated.

If there is no error in the received CRC code word, the sum from the adder 8 is 0. The logical sum circuit 9 then outputs a CRC flag indicating no error in the CRC code word. In this case, the decoded CRC code polynomial DC(X), which is a sum, is 0, in other words the decoded CRC code is 0.

As a result, the encoding/decoding system 56 performs succeeding processing after confirming no error in the received CRC code word.

If there is an error in the received CRC code word, at least one bit in the sum from the adder 8 is 1. The logical sum circuit 9 then outputs a CRC flag indicating that the CRC code word contains an error. In this case, the decoded CRC code polynomial DC(X), which is a sum, has a value other than 0', in other words, the decoded CRC code is other than 0.

As a result, the encoding/decoding system 56 recognizes that there is an error in the received CRC code word and stops succeeding processing. The CRC code in the CRC code word may be corrected by using the decoded CRC code output from the adder 8.

In the CRC circuit having the described configuration, when encoding, the CRC code word is obtained by adding the remainder, which is only based on the data for the CRC code word, with the CRC intrinsic value. The CRC intrinsic value is influenced by the content of the fixed pattern 10 and the respective code lengths of the data 20 and the CRC code 30, but not influenced by the respective contents of the data 20 and the CRC code 30. Accordingly, the CRC circuit speeds up the generator of a CRC code, since the CRC code is obtained without inputting the fixed pattern 10 to the dividing circuit 1 (this effect is referred to as a first effect, hereinafter).

Moreover in the CRC circuit, when a code error is detected, a CRC flag (an error detection signal) is obtained by adding the remainder, based on the data from the CRC code word, to the CRC intrinsic value, and calculating a logical sum of the resulting sum. Accordingly, the CRC circuit speeds up the detection of an error in a CRC code word, since the CRC flag is obtained without inputting the fixed pattern 10 to the dividing circuit 1 (this effect is referred to as a second effect, hereinafter).

Furthermore, in the CRC circuit, each of the storage devices 2(1)–2(32) operates selectively as a shift register, or as a storage device for maintaining the content stored therein. Accordingly, even if the data is input intermittently, for example, as shown in FIG. 6A, the dividing circuit 1 performs the division accurately (this effect is referred to as a third effect, hereinafter).

In this first embodiment, a three-input adder is used as an adder 8. The present invention is not restricted to the adder described above, however, and any adder can be used as long as it adds remainder data from the dividing circuit and a CRC intrinsic value to output a sum when encoding, and it adds remainder data, a CRC intrinsic value, and a CRC code from the received CRC code word to output a sum when a code error is detected.

Figure 7:
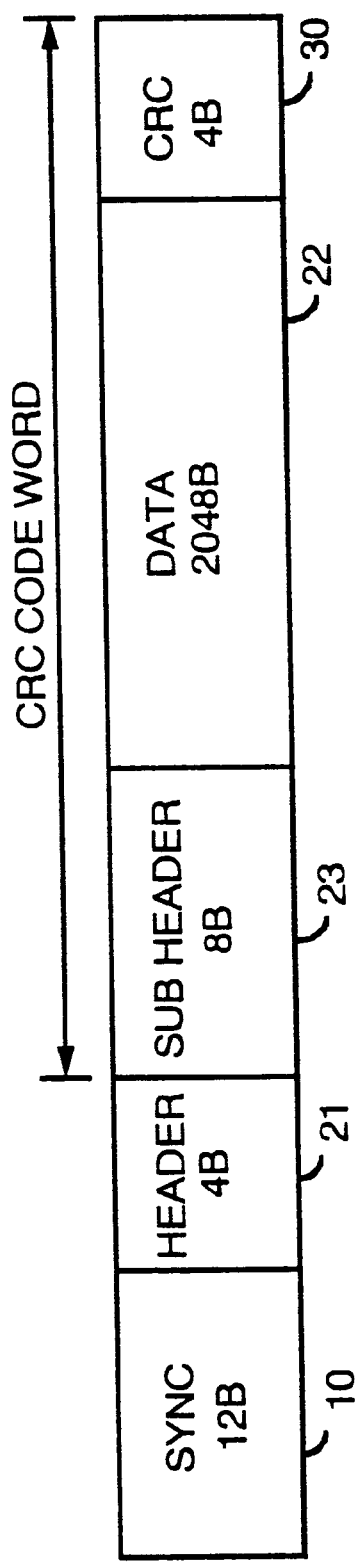
FIG. 7 is a data format diagram showing a CRC code word in the CD-ROM MODE 2 applied to the present invention.

The CRC circuit is also applicable to a CRC code word in the CD-ROM MODE 2 as shown in FIG. 7, in the same way as the CRC code word in the CDROM MODE 1 as shown in FIG. 4 and FIG. 5.

A CRC code word in the CD-ROM MODE 2 comprises data 20 with a sub header portion 23 having 8 bytes and a data portion 22 having 2048-bytes, and a CRC code 30 having 4 bytes. A fixed pattern 10 having 12 bytes is not included in the CRC code word.

In this case, when encoding, the unencoded CRC code word is input sequentially in the order of the 8-byte sub header portion 23, 2048-byte data portion 22, and 4-byte "0" information, to the dividing circuit 1. The unencoded CRC code word is divided by g(X) and the remainder resulting from the division is added to the CRC intrinsic value in the adder 8 to obtain an encoded CRC code.

When a code error is detected, the received CRC code word is input sequentially in the order of the 8-byte sub header portion 23, 2048-byte data portion 22, and 4-byte CRC code 300 to the dividing circuit 1. The received CRC code word is divided by g(X) and the remainder resulting from the division is added to the CRC intrinsic value in the adder 8, and the resulting sum is further input to the logical sum circuit 9, where a logical sum, output as a CRC flag, is calculated.

In the CRC circuit, the data can be input using a plurality of bit widths to the dividing circuit 1, although in the above description, the data is input serially using one bit from the code data input terminal 3, to the dividing circuit 1. The present invention is not restricted to a particular method for inputting a CRC code word to the dividing circuit 1 or a particular configuration of a dividing circuit 1, as long as the dividing circuit 1 provides a remainder by dividing the CRC code word data by the generator polynomial g(X) of the CRC code word.

Embodiment 2.

Figure 8:
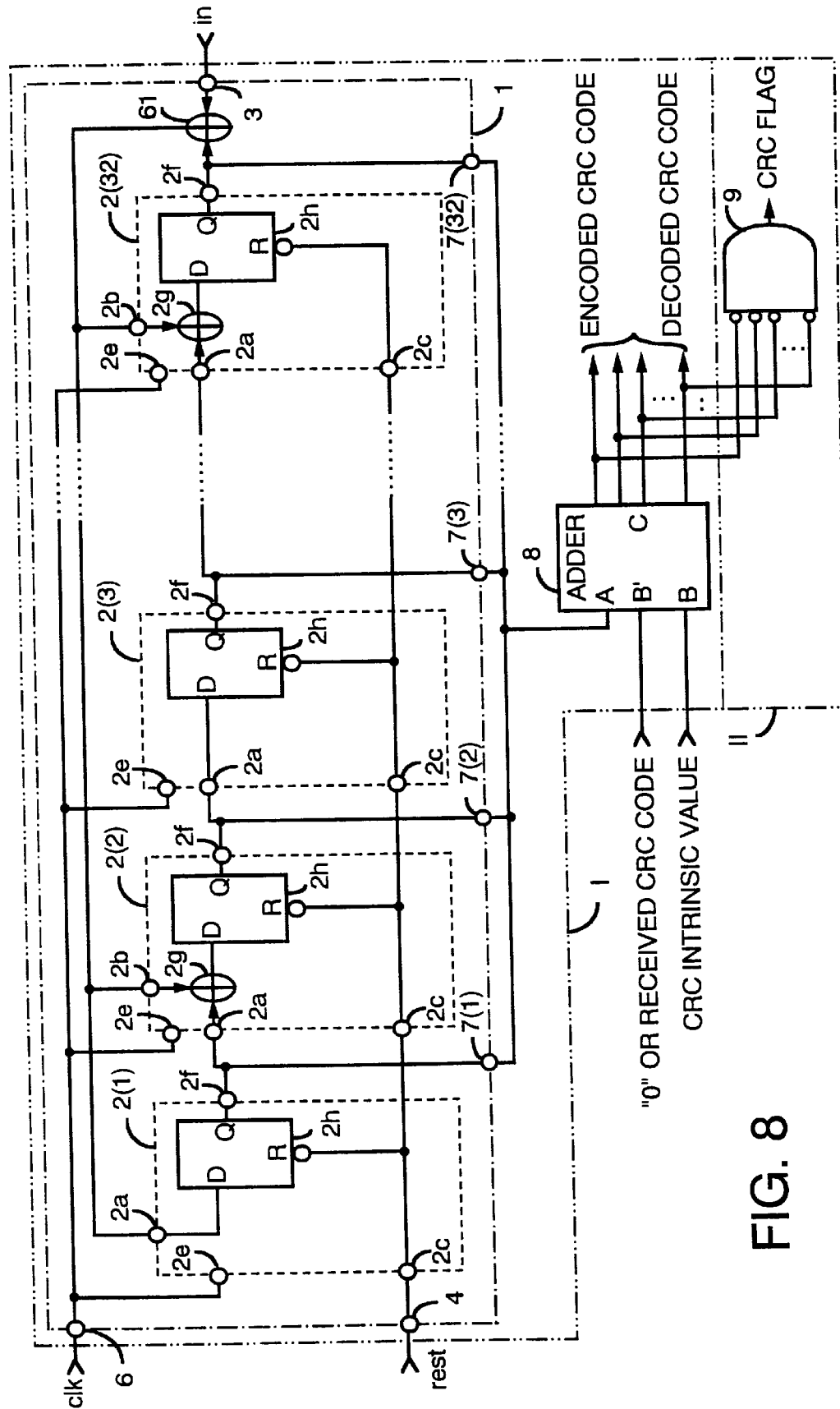
FIG. 8 is a circuit configuration diagram showing a second embodiment of the present invention.
Figure 9:
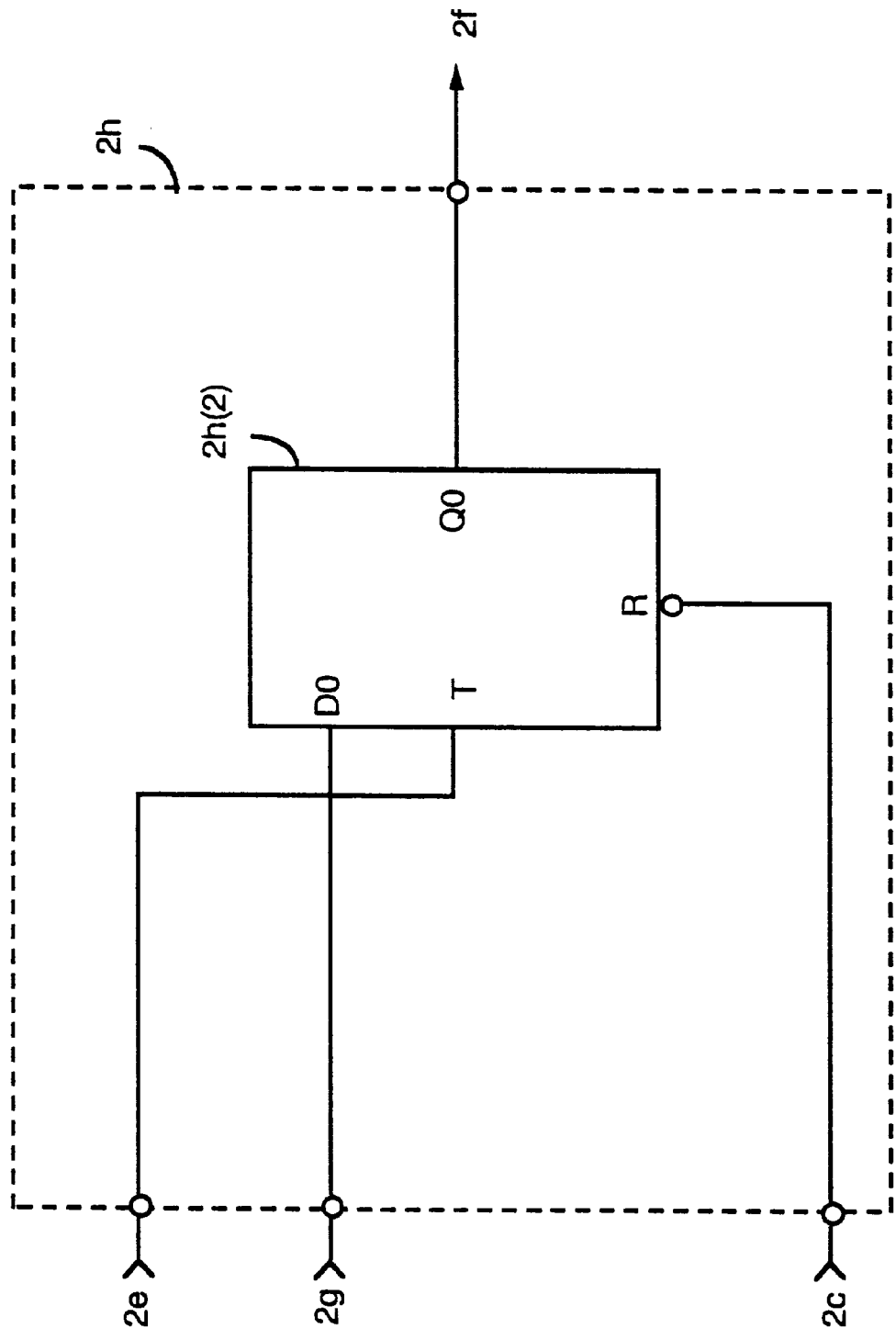
FIG. 9 is a block diagram showing a storage portion 2h in each of the storage devices 2(1)–2(32) according to the second embodiment and a fourth embodiment of the present invention.

FIG. 8 and FIG. 9 respectively show a second embodiment which is the same as the first embodiment except for the following points.

In the first embodiment, as described above, each of the storage devices 2(1)–2(32) consists of a storing circuit comprising a selector 2h(1) and a flip-flop 2h(2) so that each storage device operates selectively as a shift register or as a storage device for maintaining the content stored therein, in response to the data input control signal (enable signal) enbl. In the second embodiment, each of the storage devices 2(1)–2(32) consists of a storing circuit which comprises only a flip-flop circuit 2h(2), and no selector 2h(1), as shown in FIG. 9. Furthermore, in the second embodiment, the input node D of the flip-flop 2h(2) directly receives the output signal from the logic circuit 2g or the output signal from the first input node 2a.

With regard to the points except those mentioned above, the configuration of the second embodiment is similar to that of the first embodiment.

In FIG. 8 and FIG. 9, like reference numbers refer to the same portions as or corresponding portions to those in FIG. 1.

Even in a CRC circuit according to the second embodiment, the dividing circuit 1 outputs a remainder by performing division in the same manner as the first embodiment, as long as the encoding input data and error detection input data, which are input to the dividing circuit 1, are input to the code data input terminal 3 so that the next bit is input at the rising edge of the clock signal "clk", input to the clock signal input terminal 6.

If encoded input data and input data input during error detection input to the dividing circuit 1 do not include intermittent data at the code data input terminal 3, the same clock signal "clk" used in the first embodiment is also applicable to the second embodiment. If intermittent data including dropped data is input to the code data input terminal 3 of the dividing circuit 1, a clock signal that rises at the next bit of the CRC code word is input to the clock signal input terminal 6.

Accordingly, in the CRC circuit according to the second embodiment, it is also possible to obtain the first and second effects explained for the first embodiment.

Embodiment 3.

Figure 10:
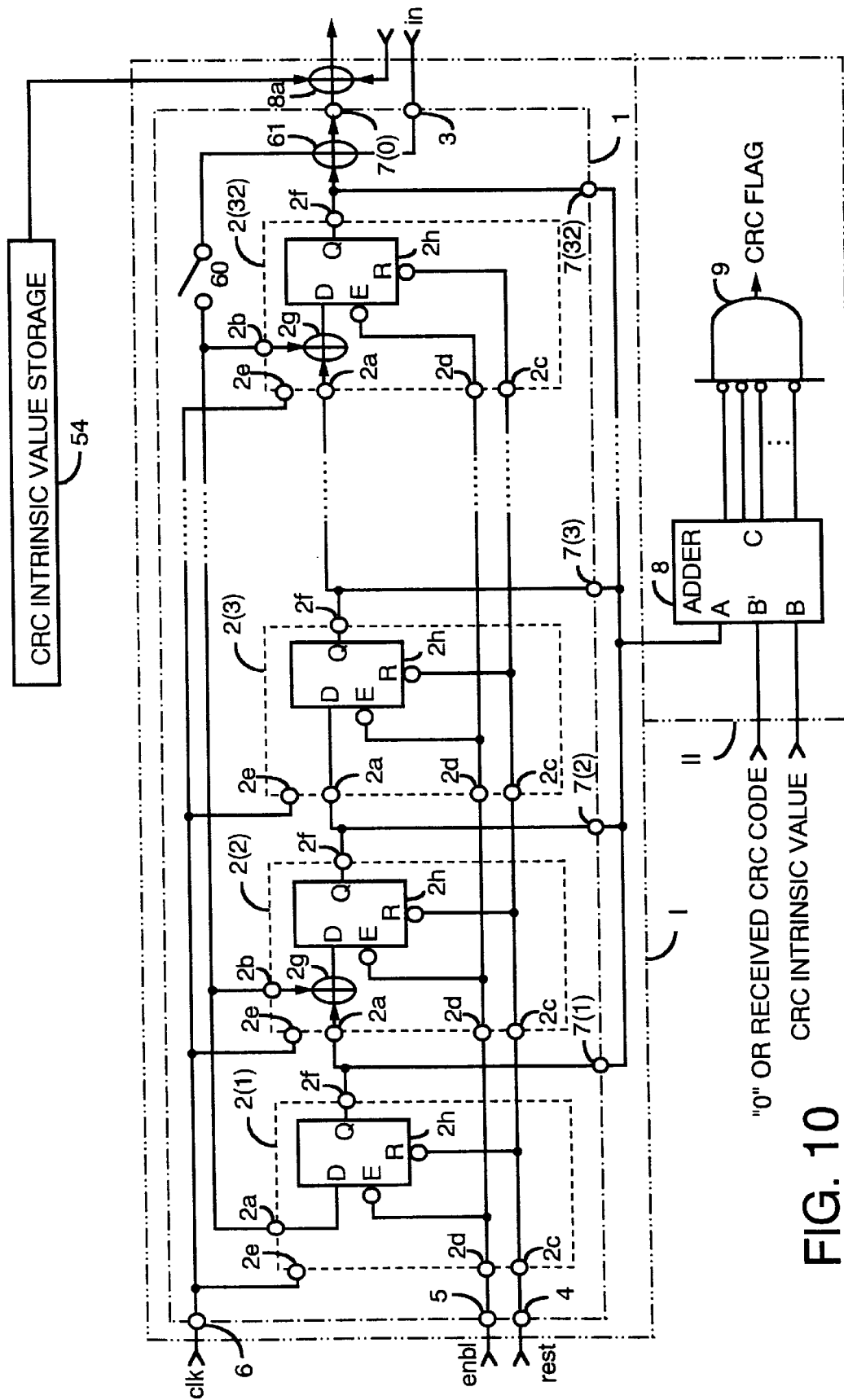
FIG. 10 is a circuit configuration diagram showing the third embodiment of the present invention.

FIG. 10 shows a third embodiment, which is the same as the first embodiment, except for the following points.

A first difference is that, the dividing circuit 1 comprises a serial data output terminal 7(0) for serially outputting the remainder, instead of the parallel data output terminals 7(1)–7(32).

The serial data output terminal 7(0) is connected to the output node of the input-side logic circuit 61. In FIG. 10, the first input node 2a of the first-stage storage device 2(1) and the second input node 2b in each storage device of the first group are shown as being connected to a different output node from the output node connected to the serial data output terminal 7(0). However, the same output node may be connected to both.

A second difference is that the serial data output terminal 7(0) is further added to the dividing circuit 1. The first switching means 60 is arranged between the output node of the input side logic circuit 61 and the first input node 2a of the first-stage storage device 2(1). The first switching means 60 is also arranged between the output node of the input side logic circuit 61 and the respective second input nodes 2b of the six storage devices of the first group, i.e., the storage devices 2(2), 2(4), 2(5), 2(16), 2(17), and 2(32) in the respective second, fourth, fifth, sixteenth, seventeenth, and thirty-second stages, in the third embodiment. The first switching means 60 turns on and the output node 2f in the storage device 2(32) in the last stage and the first input node 2a of the first-stage storage device 2(1), as well as the respective input nodes 2b in the storage devices of the first group, become conductive (hereinafter, "on" state) when the dividing circuit 1 performs division. When the remainder is output from the serial data output terminal 7(0), the first switching means 60 provides "0" information to the first input node 2a of the first-stage storage device 2(1) as well as to the respective second input nodes 2b in the storage devices of the first group (hereinafter, "off" state).

A third difference is that since a division result is serially output from the serial data output terminal 7(0), the adder 8a for outputting an encoded CRC code and a decoded CRC code adds the remainder from the serial data output terminal 7(0) of the dividing circuit 1, the CRC intrinsic value which is serially input, and "0" when encoding (or a CRC code of the CRC code word received when detecting code errors) for several output.

The adder 8a consists of an exclusive logical sum circuit having three inputs in this third embodiment. In encoding, since "0" is input, the adder 8 is substantially the same as a two-input adder comprising first and second input terminals.

A fourth difference is that since the CRC intrinsic value is input to the adder 8a, a CRC intrinsic value storage device 54 can output a CRC intrinsic value in parallel and also serially.

A fifth difference is that a flag output means includes an adder for adding the remainder from the parallel data output terminals 7(1)–7(32) in the dividing circuit 1, the CRC intrinsic value output in parallel from the CRC intrinsic value storage device 54, and a CRC code from a received CRC code word, and a logical sum calculator 9 for calculating a logical sum of the outputs from the adder 8.

The remaining portions are the same as those in the first embodiment. In FIG. 10, like reference numbers are attached to the same portions as and corresponding portions to those presented in FIG. 1.

The operation of a CRC circuit is explained respectively with regard to encoding and code-error detecting.

[Encoding]

Before generating an encoded CRC code, an "L"-level of the reset signal "rest" is applied to the reset signal input terminal 4 of the dividing circuit so that all the content stored in the respective flip-flop circuits 2h(2) in the respective storage portions 2h in the all storage devices 2(1)–2(32) are reset, in other words, initialized to "0". The first switching means 60 is set to the "on" state.

In other words, all the storage devices 2(1)–2(32) in the dividing circuit 1 are initialized and the respective reset signals are set to "H" level.

In this set state, as shown by FIG. 6A, data having a plurality of bits for the CRC code word, which is temporarily stored in the encoding/decoding data temporary storage device 51, is provided to the code data input terminal 3 of the dividing circuit 1 in synchronization with the clock signal "clk" shown by FIG. 6B. The data for a CRC code word is input into the code data input terminal 3 of the dividing circuit 1, in the same manner as in the first embodiment.

The data for the CRC code word, input as mentioned above, is received in the dividing circuit 1 according to the data input control signal "enbl" input into the data input control terminal 5 and the clock signal "clk" input into the clock signal input terminal 6. Then the data for the CRC code word is divided by g(X) and the remainder from the division is stored in each of the storage devices 2(1)–2(32) in the division circuit 1, in the same manner as in the first embodiment.

The first switching means 60 becomes "off" state when all the data for the CRC code word is input and the dividing circuit 1 completes the division.

As a result, "0" information is provided to the first input node 2a of the first-stage storage 2(1) and the respective second input nodes 2b of the six storage devices 2(2), 2(4), 2(5), 2(16), 2(17), and 2(32) in the respective second, fourth, fifth, sixteenth, seventeenth, and thirty-second stages.

Accordingly, the logic circuit 2g in the respective storage device of the first group passes the information input to the first input node 2a on to the storage portion 2h.

Accordingly, the dividing circuit 1 operates as a shift register for transmitting the content stored in the respective storage devices 2(1)–2(32) sequentially in synchronization with the clock signal "clk" input to the clock signal input terminal 6 so that the remainder is outputted serially for every bit from the serial data output terminal 7(0).

The data for the CRC code word is divided by g(X) in the dividing circuit 1, and the remainder is output from the serial data output terminal 7(0) of the dividing circuit 1.

The remainder data output from the serial data output terminal 7(0) of the dividing circuit 1 is input into the input terminal of the adder 8a, and added to the CRC intrinsic value and "0" input from the other input terminal of the adder 8a.

The output from the adder 8 has a value derived from equation (7), and constitutes a CRC code for the CRC code word to be transmitted (encoded CRC code). This encoded CRC code is then synthesized with a fixed pattern of a plurality of bits in the corresponding CRC code word and data stored in the encoding/decoding data temporary storage device 51, and transmitted to the other systems via the inside bus 57 and the outside bus 58 as a CRC code word.

[Detecting code errors]

Before detecting code errors in CRC code words to be transmitted, an "L"-level of the reset signal "rest" is applied to the reset signal input terminal 4 in the dividing circuit 1 so that all the content stored in the flip-flops $2h(2)$ in the storage portions $2h$ in the respective storage devices $2(1)$–$2(32)$ in the dividing circuit 1 are reset, i.e., initialized to "0". The first switching means 60 are set to ON state.

All the storage devices $2(1)$–$2(32)$ in the dividing circuit 1 are initialized, and respective reset signals are set to "H" level.

The data in the received CRC code word which is transmitted via the outside bus 58 and the inside bus 57 is temporarily stored in the encoding/decoding data temporary storage device 51, and the CRC code from the received CRC code word is temporarily stored in the received CRC code temporary storage device 52.

As shown in FIG. 6A, in the "set" state of the respective storage devices $2(1)$–$2(32)$, the data from the received CRC code word, temporarily stored in the encoding/decoding data temporary storage device 51, is provided to the code data input terminal 3 of the dividing circuit 1 in synchronization with the clock signal "clk" as shown in FIG. 6B. The data from the received CRC code word is input into the code data input terminal 3 of the dividing circuit 1, in the same manner as in the first embodiment.

The data from the received CRC code word is received in the dividing circuit 1, in the same manner as in the above encoding, according to the data input control signal "enbl" input into the data input control terminal 5 and the clock signal "clk" input into the clock signal input terminal 6. Then, the data from the received CRC code word is divided by g(X) and the remainder from is output from each of the parallel data output terminals $7(1)$–$7(32)$ in the division circuit 1, in the same manner as in the first embodiment.

The remainder data output from the respective parallel data output terminals $7(1)$–$7(32)$ of the dividing circuit 1 is input to the first input terminal A of the adder 8 which adds the input remainder data, the CRC intrinsic value input to the second input terminal B and the CRC code from the received CRC code word input to the third input terminal B', i.e., the CRC code is temporarily stored in the received CRC code temporary storage device 52.

The output from the adder 8 has a value derived from the equation (12). The output as a result of the addition is input into the logical sum circuit 9, where a logical sum is calculated.

If there is no error in the received CRC code word, the addition result from the adder 8 is 0. The logical sum circuit 9 then outputs a CRC flag indicating no error in the CRC code word ("H" level in the third embodiment). In this case, the decoded CRC code polynomial DC(X), resulting from the addition, is 0, in other words, the decoded CRC code is 0.

As a result, the encoding/decoding system 56 performs succeeding processing after confirming no error in the received CRC code word.

If there is an error in the received CRC code word, at least one bit in the sum from the adder 8 is 1. The logical sum circuit 9 then outputs a CRC flag indicating that the CRC code word contains an error ("L" level in the third embodiment). In this case, the decoded CRC code polynomial DC(X), resulting from the addition, has a value other than 0, in other words, the decoded CRC code has a value other than 0.

As a result, the encoding/decoding system 56 recognizes that there is an error in the received CRC code word and stops succeeding processing. The CRC code from the received CRC code word may be corrected using the decoded CRC code output from the adder 8.

Furthermore, by setting the first switch 60 to an "off" state, the dividing circuit 1 operates as a serial register for outputting the remainder serially from the serial data output terminal 7(0), and providing a CRC intrinsic value from the CRC intrinsic value storage device 54 and a CRC code temporarily stored in the received CRC code temporary storage device 52 to the adder 8a, serially.

As a result, since a decoded CRC code not "0" is output from the adder 8a, the CRC code from the received CRC code word may be corrected using this output decoded CRC code.

Accordingly, in the CRC circuit the first, second, and third effects as mentioned for the first embodiment are obtained.

Moreover, since the adder 8 adds the data from the parallel data output terminals $7(1)$–$7(32)$ of the dividing circuit 1, the CRC intrinsic value, and a received CRC code, and the logical sum circuit 9 calculates a logical sum to output a CRC flag, the circuit speeds up the detection of an error in a CRC code word (the fourth effect).

Furthermore, if a CRC flag indicates that the CRC code word contains an error, a decoded CRC code for an error is obtained from the adder 8a (the fifth effect, hereinafter).

Embodiment 4.

Figure 11:
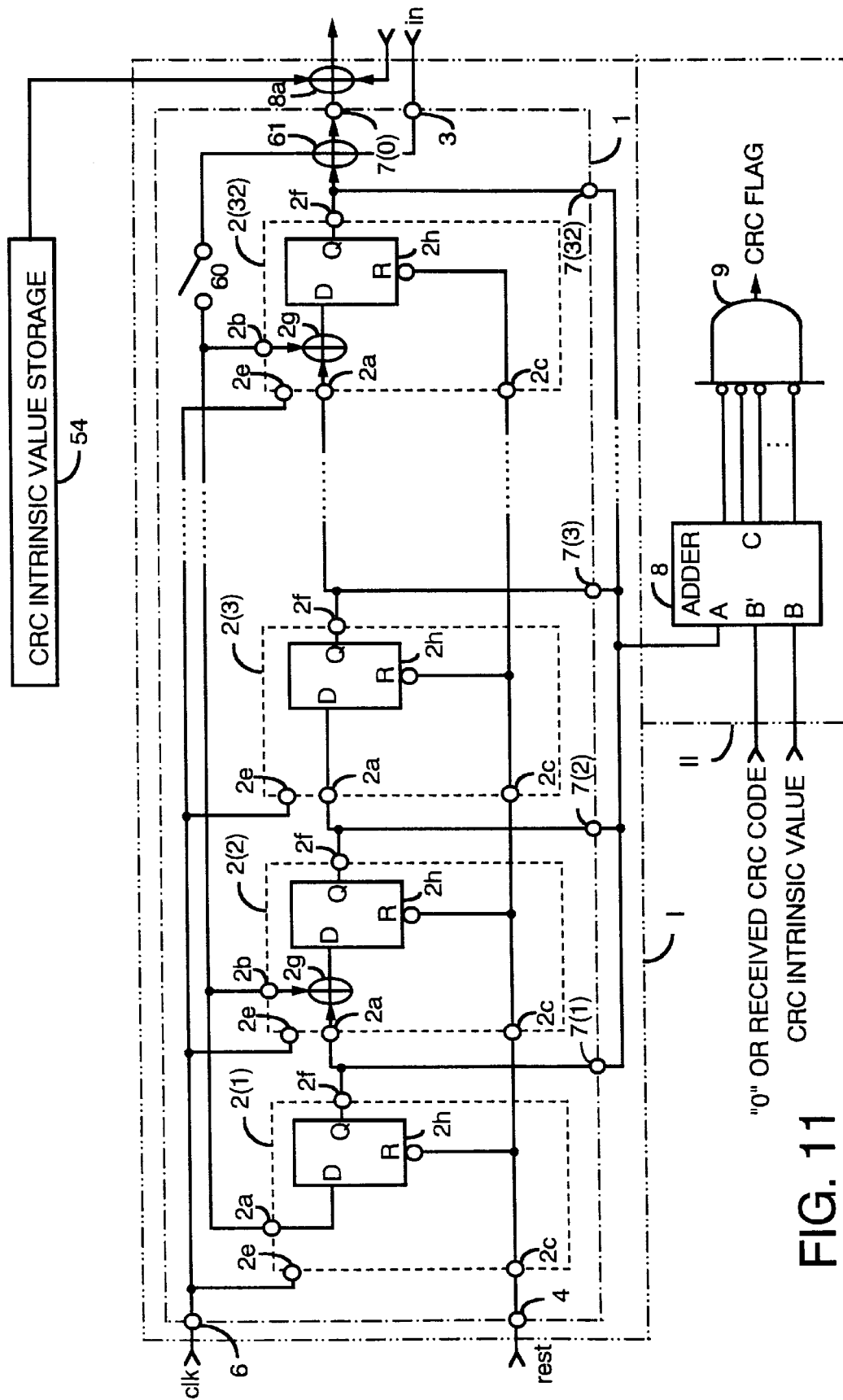
FIG. 11 is a circuit configuration diagram showing the fourth embodiment of the present invention.

FIG. 11 shows a fourth embodiment which is the same as the third 46 embodiment except for the following points.

As shown in the third embodiment, each of the storage devices $2(1)$–$2(32)$ consists of a storing circuit which comprises a selector $2h(1)$ and a flip-flop $2h(2)$. Each storage device $2(1)$–$2(32)$ operates selectively as a shift register or as a storage device for maintaining the content stored therein, according to the data input control signal (enable signal) enbl.

In the fourth embodiment, similar to the second embodiment, each of the storage devices $2(1)$–$2(32)$ consists of a storing circuit which comprises only a flip-flop circuit $2h(2)$, and no selector $2h(1)$, as shown in FIG. 9. Furthermore, in the fourth embodiment, the input node D of the flip-flop $2h(2)$ directly receives the output from the logic circuit $2g$ or the output from the first input node $2a$.

With regard to all other points, the configuration of the fourth embodiment is similar to that of the third embodiment. In FIG. 11, like reference numbers are attached to the same portions as or corresponding portions to those presented in FIG. 1 and FIG. 10.

Even in a CRC circuit having a configuration as mentioned in the fourth embodiment, the dividing circuit 1 outputs a remainder by division in the same manner as the third embodiment, as long as the encoding input data and the error detection input data, input to the dividing circuit 1, are input to the encode data input terminal 3 in a similar manner to the third embodiment.

Accordingly, in the CRC circuit having a configuration as mentioned in the fourth embodiment, it is possible to obtain the first and second effects, as explained for the first embodiment, as well as the fourth and the fifth effects, as explained for the third embodiment.

What is claimed is:

1. A CRC code generation circuit comprising:

a dividing circuit having a data input terminal for receiving a plurality of data bits to be included in a CRC code word, as input to the data input terminal, the CRC code word to comprise a fixed pattern of a plurality of bits and a CRC code of r bits, r being an integer larger than one, multiplying the received data bits by $X^r$ to produce a product, dividing the product by a generator polynomial g(X) of the CRC code word to output remainder data of r bits; and an adder for adding the remainder data, a CRC intrinsic value of r bits derived from the fixed pattern, and a number to produce a sum, and outputting the sum as an encoded CRC code for the data bits input to said dividing circuit.

2. The CRC code generation circuit according to claim 1, wherein said dividing circuit comprises a serial data output terminal for serially outputting the remainder data; and said adder adds the remainder data from said serial data output terminal of said dividing circuit and the CRC intrinsic value, serially input and serially outputs the addition result for every bit.

3. A code error detection circuit for detecting a code error in a CRC code word comprising:

a dividing circuit having a data input terminal for receiving a plurality of data bits of a CRC code word, as input to the data input terminal, the CRC code word comprising a fixed pattern of a plurality of bits and a CRC code of r bits, r being an integer larger than one, multiplying the received data bits by $X^r$ to produce a product, dividing the product by a generator polynomial g(X) of a CRC code word to output remainder data having r bits from r parallel data output terminals; and flag output means for outputting a CRC flag indicating a correct CRC code word or an erroneous CRC code word for the data bits input to said dividing circuit, according to the remainder data from said dividing circuit and a CRC intrinsic value wherein, said flag output means comprises:

a first adder for adding the CRC intrinsic value, the remainder data, and the CRC code of the CRC code word to produce a sum; and a logical sum circuit for calculating a logical sum of the bits of the sum prescribed by said first adder to output the logical sum as a CRC flag.

4. The code error detection circuit according to claim 3, wherein said first adder outputs the sum as a decoded CRC code for the data input from the data input terminal of said dividing circuit.

5. The code error detection circuit according to claim 3, wherein said dividing circuit comprises a serial data output terminal for serially outputting the remainder data; and a second adder for adding remainder data from a serial data output terminal of said dividing circuit and a CRC intrinsic value, input serially, and serially outputting a decoded sum as a result.

6. A CRC circuit that operates as a CRC code generation circuit and a code error detection circuit comprising:

a dividing circuit having a data input terminal for receiving a plurality of data bits of, or for, a CRC code word, as input to the data input terminal, the CRC code word comprising, or to comprise, a fixed pattern of a plurality of bits and a CRC code of r bits, r being an integer greater than one, multiplying the received data bits by $X^r$ to produce a product, dividing the product by a generator polynomial g(X) of a CRC code word, to output remainder data having r bits from r parallel data output terminals;

an adder, said adder, when said CRC circuit is encoding, adding the remainder data from r data output terminals of said dividing circuit and a CRC intrinsic value, and outputting a sum as an encoded CRC code for the data bits input to the data input terminal of said dividing circuit, said adder, when said CRC circuit is detecting code errors, adding the remainder data from said r parallel data output terminals of said dividing circuit, a CRC code of the CRC code word for the data bits input to the data terminal of said dividing circuit, and the CRC intrinsic value, to produce a sum; and a logical sum circuit for calculating a logical sum of of the bits of the sum produced by said adder to output the logical sum as a CRC flag when detecting code errors.

7. The CRC circuit according to claim 6, wherein said adder outputs the sum as a decoded CRC code for the data input from the data input terminal of said dividing circuit, when a code error is detected.

8. A CRC circuit that operates as a CRC code generation circuit and a code error detection circuit comprising:

a dividing circuit having a data input terminal, said dividing circuit, when said CRC circuit is encoding, receiving a plurality of data bits to be included in a CRC code word, as input to the data input terminal, the CRC code word to comprise a fixed pattern of a plurality of bits and a CRC code of r bits, r being an integer greater than one, multiplying the received data by $X^r$ to produce a product, dividing the product by a generator polynomial g(X) of a CRC code word, and outputting remainder data having r bits from a serial data output terminal; and said dividing circuit, when said CRC circuit is detecting code errors, receiving a Plurality of data bits from a received CRC code word, multiplying the received data bits by $X^r$ to produce a product, dividing the product by a generator polynomial g(X) of a CRC code word, and outputting remainder data having r bits from r parallel data output terminals;

an adder for adding the remainder data from the serial data output terminal of said dividing circuit and a CRC intrinsic value to produce a sum, and, when said CRC circuit is encoding, for serially outputting the sum as an encoded CRC code for the data bits input to the data input terminal of said dividing circuit; and flag output means comprising an adder for, when said CRC circuit is detecting code errors, adding the CRC intrinsic value, the remainder data from the parallel data output terminals of said dividing circuit, and a CRC code from the received CRC code word to produce a sum, and a logical sum circuit for calculating a logical sum of the bits of the sum from the adder to output the logical sum as a CRC flag.

9. The CRC circuit according to claim 8, wherein, when said CRC circuit is detecting code errors, said dividing circuit serially outputs the remainder data of r bits from the serial data output terminal, if a CRC flag output from the logical sum circuit of the flag output means indicates that there is an error in the received CRC code word, and, when said CRC circuit is detecting code errors, said dividing circuit serially outputs a sum as a decoded CRC code for the received CRC code word.

10. The CRC circuit according to claim 6, wherein said dividing circuit comprises r stages of storage means corresponding to r parallel data output terminals wherein
respective storage means are in either a first group or a second group according to the generation polynomial g(X) of the CRC code word, each of said storage means in the first group comprises:
a first input node, a second input node, and an output node connected to a corresponding one of the parallel data output terminals;
a logic circuit for calculating an exclusive logical sum of the data input respectively to the first and second input nodes; and
a storage portion comprising an input node A0 for receiving an output from the logic circuit, an input node B0, an output node C0, and a selective input node, and a selector for outputting either data input from the input node A0 or data input from the input node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector; and
each of said storage means in the second group comprises:
a first input node and an output node connected to a corresponding one of the parallel data output terminals; and
a storage portion comprising an input node A0 for receiving data input to the first node, an input node B0, an output node C0, and a selective input node, and a selector for outputting either data input from the input node A0 or data input from the output node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector, wherein, a first input node of each stage of said storage means other than the first stage is connected to the output node of said storage means of the preceding stage; and
an input-side logic circuit for calculating an exclusive logical sum of a data input from the first data input terminal and data from the output node of said storage means of the last stage, and for providing the exclusive logical sum to the first input node of a first-stage storage means and the second input node of the respective storage means in the first group.

11. The CRC circuit according to claim 8, wherein said dividing circuit comprises r stages of storage means corresponding to r parallel data output terminals wherein
respective storage means are in either a first group or a second group according to the generation polynomial g(X) of the CRC code word, each of said storage means in the first group comprises:
a first input node, a second input nodes and an output node connected to a corresponding one of the parallel data output terminals;
a logic circuit for calculating an exclusive logical sum of the data input respectively to the first and second input nodes; and
a storage portion comprising an input node A0 for receiving an output from the logic circuit, an input node B0, an output node C0, and a selective input node, and a selector for outputting either data input from the input node A0 or data input from the input node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector; and
each of said storage means in the second group comprises:
a first input node and an output node connected to a corresponding one of the parallel data output terminals; and
a storage portion comprising an input node A0 for receiving data input to the first node, an input node B0, an output node C0, and a selective input node, and a selector for outputting either data input from the input node A0 or data input from the output node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector, wherein, a first input node of each stage of said storage means other than the first stage is connected to the output node of said storage means of the preceding stage; and
an input-side logic circuit for calculating an exclusive logical sum of a data input from the first data input terminal and data from the output node of said storage means of the last stage, and for providing the exclusive logical sum to the first input node of a first-stage storage means and the second input node of the respective storage means in the first group.

12. The CRC circuit according to claim 8, wherein said dividing circuit comprises r stages of storage means corresponding to r parallel data output terminals wherein
respective storage means are in either a first group or a second group according to the generation polynomial g(X) of the CRC code word, each of said storage means in the first group comprises:
a first input node, a second input node, and an output node connected to a corresponding one of the parallel data output terminals;
a logic circuit for calculating an exclusive logical sum of the data input respectively to the first and second input nodes; and
a storage portion comprising an input node A0 for receiving an output from the logic circuit, an input node B0, an output node C0, and a selective input node, and a selector for outputting either data input from the input node A0 or data input from the input node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector; and each of said storage means in the second group comprises:

a first input node and an output node connected to a corresponding one of the parallel data output terminals of said dividing circuit; and a storage portion comprising an input node A0 for receiving data input to the first node, an input node B0, an output node C0, and a selective input node, and a selector for outputting either data input from the input node A0 or data input from the output node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector; wherein, a first input node of each stage of said storage means other than the first stage is connected to the output node of said storage means of the preceding stage;

an input-side logic circuit for calculating an exclusive logical sum of a data input from the first data input terminal and data from the output node of said storage means of the last stage, and outputting the exclusive logical sum to the serial data output terminal of said dividing circuit; and a first switching means arranged between the output node of said input-side logic circuit and the first input node of the first-stage storage means and the second input nodes of the respective storage means in the first group, for connecting the output node of said input-side logic circuit to the first input node of the first-stage storage means and the second input nodes of the respective storage means in the first group while said dividing circuit performs a division operation, and for providing "0" information to the first input node of the first-stage storage means and the second input nodes of the respective storage means in the first group when remainder data is output from the serial data output terminal of said dividing circuit.

13. The CRC circuit according to claim 9, wherein said dividing circuit comprises r stages of storage means corresponding to r parallel data output terminals wherein respective storage means are in either a first group or a second group according to the generation polynomial g(X) of the CRC code word, each of said storage means in the first group comprises:

a first input node, a second input node, and an output node connected to a corresponding one of the parallel data output terminals;

a logic circuit for calculating an exclusive logical sum of the data input respectively to the first and second input nodes; and a storage portion comprising an input node A0 for receiving an output from the logic circuit, an input node B0, an output node C0, and a selective input node, and a selector for outputting either data input from the input node A0 or data input from the input node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector; and each of said storage means in the second group comprises:

a first input node and an output node connected to a corresponding one of the parallel data output terminals of said dividing circuit; and a storage portion comprising an input node A0 for receiving data input to the first node, an input node B0, an output node C0, and a selective input node, and a selector for outputting either data input from the input node A0 or data input from the output node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector; wherein, a first input node of each stage of said storage means other than the first stage is connected to the output node of said storage means of the preceding stage;

an input-side logic circuit for calculating an exclusive logical sum of a data input from the first data input terminal and data from the output node of said storage means of the last stage, and outputting the exclusive logical sum to the serial data output terminal of said dividing circuit; and a first switching means arranged between the output node of said input-side logic circuit and the first input node of the first-stage storage means and the second input nodes of the respective storage means in the first group, for connecting the output node of said input-side logic circuit to the first input node of the first-stage storage means and the second input nodes of the respective storage means in the first group while said dividing circuit performs a division operation, and for providing "0" information to the first input node of the first-stage storage means and the second input nodes of the respective storage means in the first group when remainder data is output from the serial data output terminal of said dividing circuit.

14. A CRC circuit that operates as a CRC code generation circuit and a code error detection circuit comprising:

a dividing circuit comprising:

a data input terminal, a serial data output terminal for serially outputting a plurality of bits of remainder data, the remainder data being calculated by multiplying data to be included in an encoded CRC code word or data from a received CRC code word, input to the data input terminal, by X' to produce a product, then dividing the product by a generator polynomial g(X) of a CRC code word, a plurality of parallel data output terminals for outputting the bits of the remainder data in parallel, and a plurality of stages of storage means corresponding to respective parallel data output terminals;

an adder for adding the remainder data from the serial data output terminal of said dividing circuit and a CRC intrinsic value to produce a sum and, when encoding, for outputting the sum as an encoded CRC code for the data to be included in the encoded CRC code word input to the data input terminal of said dividing circuit; and flag output means for, when said CRC circuit is detecting code errors, outputting a CRC flag indicating whether an error is present in the data from the received CRC code word input from the data input terminal of said dividing circuit, according to the remainder data from the respective parallel data output terminals of said dividing circuit and the CRC intrinsic value;

wherein, a plurality of respective storage means are in either a first group or a second group according to the generator polynomial g(X) of a CRC code word;

each of said storage means in the first group comprises:

a first input node, a second input node, and an output node connected to a corresponding one of the parallel data output terminals;

a logic circuit for calculating an exclusive logical sum of the data input respectively to the first and second input nodes; and a storage portion comprising an input node A0 for receiving an output from the logic circuit, an input node B0, an output node C0, and a selective input node, and a selector for outputting either data input from the input node A0 or data input from the input node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector; and each of said storage means in the second group comprises:

a first input node and an output node connected to a corresponding one of the parallel data output terminals; and a storage portion comprising an input node A0 for receiving data input to the first node, an input node B0, an output node C0, and a selective input node, and a selector for outputting either data input from the input node A0 or data input from the output node B0, to the output node C0 according to a data input control signal input to the selective input node, and a storing circuit for receiving an output from the output node C0 of the selector in synchronization with an input clock signal, for storing the received content, and for outputting the content to the output node and the input node B0 of the selector, wherein, a first input node of each stage of the storage means other than the first stage is connected to the output node of the storage means of the preceding stage;

an input-side logic circuit for calculating an exclusive logical sum of a data input from the first data input terminal and data from the output node of said storage means of the last stage, and outputting the exclusive logical sum to the serial data output terminal of said dividing circuit; and a first switching means arranged between the output node of said input-side logic circuit and the first input node of the first-stage storage means and the second input nodes of the respective storage means in the first group, for connecting the output node of said input-side logic circuit to the first input node of the first-stage storage means and the second input nodes of the respective storage means in the first group while said dividing circuit performs a division operation, and for providing "0" information to the first input node of the first-stage storage means and the second input nodes of the respective storage means in the first group when remainder data is output from the serial data output terminal of said dividing circuit.

\* \* \* \* \*